United States Patent
Kurasawa et al.

(10) Patent No.: US 12,172,243 B2
(45) Date of Patent: Dec. 24, 2024

(54) FLUX, RESIN FLUX CORED SOLDER USING THE FLUX, AND SOLDERING METHOD

(71) Applicant: Senju Metal Industry Co., Ltd., Tokyo (JP)

(72) Inventors: Yoko Kurasawa, Saitama (JP); Motohiro Onitsuka, Tochigi (JP); Hisashi Tokutomi, Tokyo (JP); Hiroyoshi Kawasaki, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 178 days.

(21) Appl. No.: 17/128,239

(22) Filed: Dec. 21, 2020

(65) Prior Publication Data
US 2021/0197323 A1    Jul. 1, 2021

(30) Foreign Application Priority Data
Dec. 25, 2019    (JP) ................................. 2019-234270

(51) Int. Cl.
*B23K 35/362*    (2006.01)
*B23K 35/02*    (2006.01)

(52) U.S. Cl.
CPC ........ *B23K 35/362* (2013.01); *B23K 35/0227* (2013.01)

(58) Field of Classification Search
CPC .................................................. B23K 35/362
See application file for complete search history.

(56) References Cited

U.S. PATENT DOCUMENTS

| 11,292,089 | B2 | 4/2022 | Onitsuka et al. |
| 2015/0000792 | A1 | 1/2015 | Sugiura et al. |

FOREIGN PATENT DOCUMENTS

| CN | 85106862 | A | 10/1986 |
| CN | 102284809 | A | 12/2011 |
| CN | 104349865 | A | 2/2015 |
| CN | 105458552 | A | 4/2016 |
| CN | 109676284 | A | 4/2019 |
| EP | 2805792 | A1 | 11/2014 |
| JP | H542388 | A | 2/1993 |
| JP | H542389 | A | 2/1993 |
| JP | 2007069258 | A | 3/2007 |

(Continued)

OTHER PUBLICATIONS

Substantive Examination Adverse Report from the Intellectual Property Corporation of Malaysia for related Application No. PI2020006976 dated Sep. 21, 2022.

*Primary Examiner* — Jophy S. Koshy
(74) *Attorney, Agent, or Firm* — The Webb Law Firm

(57) ABSTRACT

Provided is flux for resin flux cored solder using in a soldering method in which the resin flux cored solder is supplied into a through hole formed along a central axis of a soldering iron. The flux contains volatile rosin in an amount of 70 wt % or more and 98 wt % or less, non-volatile rosin in an amount of 0 wt % or more and 10% or less, and an activator in an amount of 2 wt % or more and 30 wt % or less, the activator including an organic acid in an amount of 0 wt % or more and 15 wt % or less, an organohalogen compound in an amount of 0.5 wt % and 15 wt % or less, an amine in an amount of 0 wt % or more and 5 wt % or less, and an amine hydrohalide salt in an amount of 0 wt % or more and 2.5 wt % or less.

15 Claims, 3 Drawing Sheets

(56) References Cited

FOREIGN PATENT DOCUMENTS

| | | | |
|---|---|---|---|
| JP | 2007069259 A | | 3/2007 |
| JP | 2009195938 A | | 9/2009 |
| JP | 2010046689 A | | 3/2010 |
| JP | 2017113776 A | * | 6/2017 |
| JP | 2019123811 A | | 7/2019 |
| WO | WO-2008085570 A2 | * | 7/2008 ......... B23K 35/0244 |

* cited by examiner

[FIG. 1]
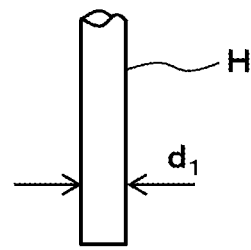
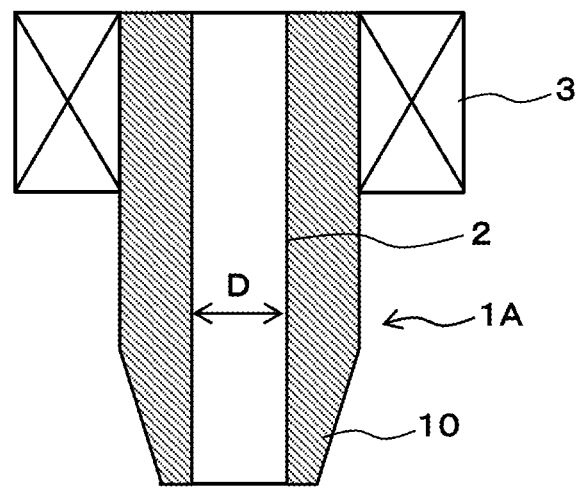
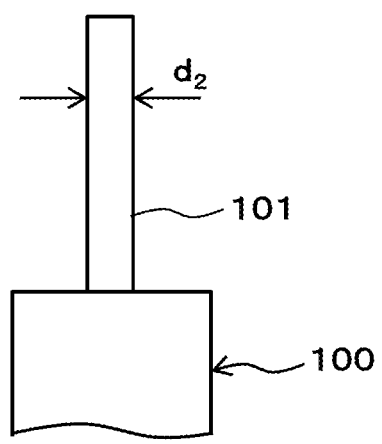

[FIG. 2A]
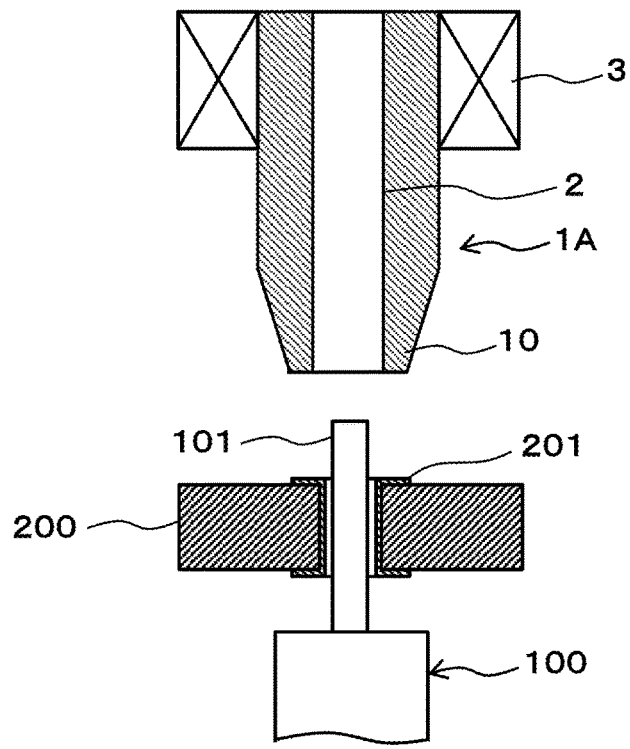
[FIG. 2B]
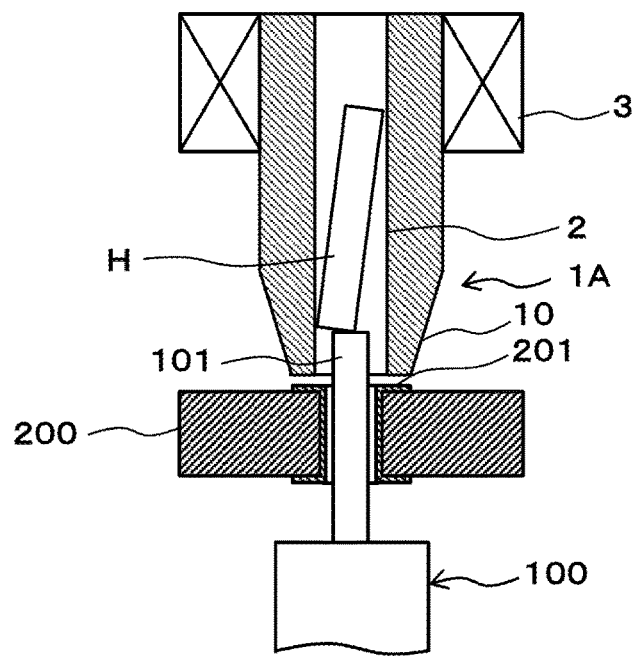

[FIG. 2C]
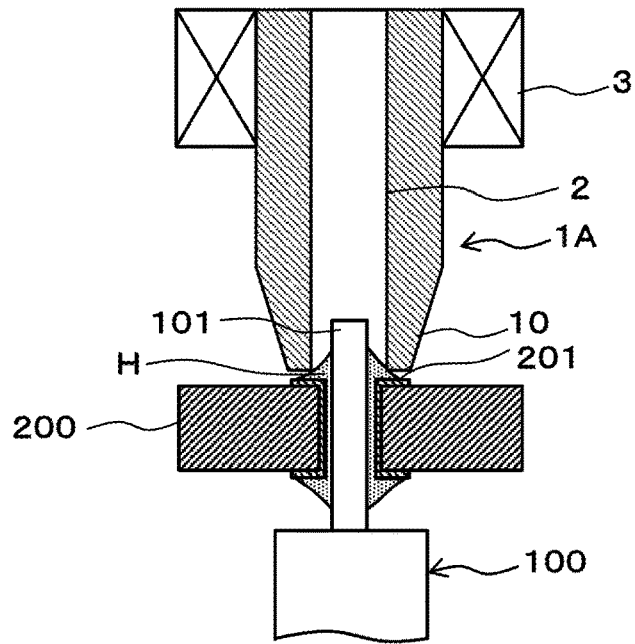
[FIG. 2D]
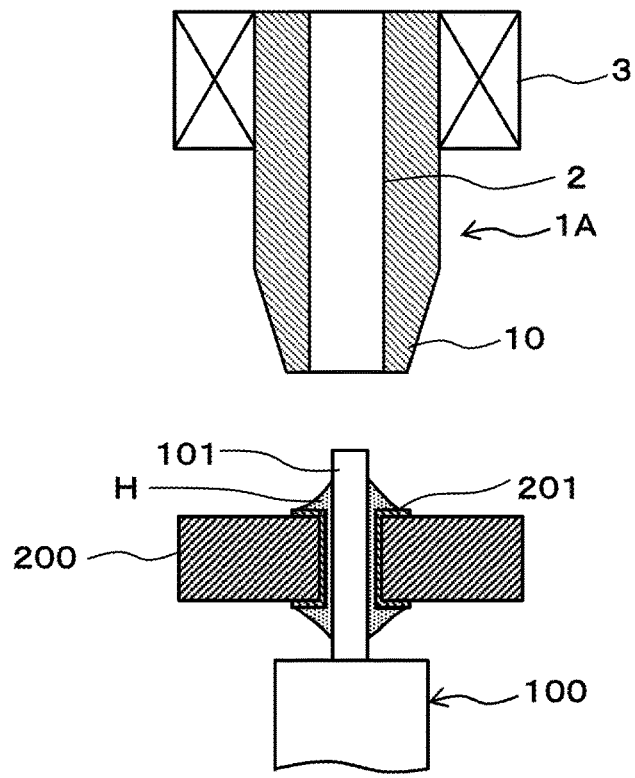

FLUX, RESIN FLUX CORED SOLDER USING THE FLUX, AND SOLDERING METHOD

CROSS REFERENCE TO RELATED APPLICATION

This application claims priority to Japanese Patent Application No. 2019-234270 filed on Dec. 25, 2019, the disclosure of which is hereby incorporated by reference in its entirety.

BACKGROUND OF THE INVENTION

(1) Field of the Invention

The present invention relates to flux, resin flux cored solder using the flux, and a soldering method.

(2) Description of Related Art

The flux used in soldering generally has effects of chemically removing metal oxides present on solder and a metal surface of a joint target to be soldered and allowing movement of metal elements at the boundary between them. Therefore, by soldering using the flux, an intermetallic compound can be formed between the solder and the metal surface of the joint target, so that strong joint can be obtained.

As the solder used in the soldering, solder named "resin flux cored solder" in which the flux is filled in wire-like solder has been proposed. Japanese Patent Application Publications Nos. H05-42388 and H05-42389 disclose flux, which is assumed to be used in such resin flux cored solder.

The flux used in the resin flux cored solder is required to be a solid or a liquid but having high viscosity behavior on processability.

As a soldering method using the resin flux cored solder, it has been known to use a heating member named "soldering iron". Whereas, Japanese Patent Application Publication No. 2009-195938 discloses a technology such that a through hole is provided at a central axis in the solder iron and the soldering is performed by supplying the resin flux cored solder into the through hole. In addition, Japanese Patent Application Publications No. 2017-113776 discloses flux for resin flux cored solder containing hydrogenated rosin, polypropylene wax and bromocarboxylic acid, which is excellent in wettability and flux-scattering resistant characteristics. Here, such excellent wettability and flux-scattering resistant characteristics are obtained by adding the polypropylene wax and a fixed activator such as bromocarboxylic acid including bromine to the hydrogenated rosin as a base resin.

SUMMARY OF THE INVENTION

The flux used in the resin flux cored solder is required to have predetermined viscosity so as to be not flown out of the solder at room temperature, and up to now, has contained a predetermined amount of rosin therein. The rosin such as polymerized rosin is hard to volatilize at a heat history estimated in soldering and becomes a chief ingredient of the residue. When a predetermined amount of such rosin is contained, an amount of residue can be increased.

When soldering is performed using the soldering iron as disclosed in Japanese Patent Application Publications No. 2009-195938, there may be a case where the rosin which is contained in the flux for the resin flux cored solder supplied into the through hole and is hard to volatilize at a heat history estimated in soldering becomes the residue after the heating and is adhered to an inside of the through hole. In the soldering using the soldering iron as disclosed in Japanese Patent Application Publications No. 2009-195938, the resin flux cored solder is supplied into the through hole and the soldering is successively performed in such a condition that the soldering iron is controlled to keep predetermined temperature which exceeds a melting point of the solder. Accordingly, any adhered matters such as the residue is successively heated to become carbides thereof, which cause any burnt deposits inside the through hole. The carbides then deposit in the through hole of the soldering iron, so that a passage in the through hole becomes narrower, thereby being possibility that the resin flux cored solder may not be supplied. When performing the soldering using the above soldering iron in which the through hole is provided at the central axis thereof like Japanese Patent Application Publications No. 2017-113776, any scattering is prevented by a cylindrical heating tool thereof so that it is not necessary to add polypropylene wax. If a thermally stable material such as the polypropylene wax is added, an amount of residue can be increased, which causes any burnt deposits inside the through hole.

The object and advantages of the below-mentioned illustrated embodiments will be set forth in and apparent from the description that follows. Additional advantages of the illustrated embodiments will be realized and attained by the devices, systems and methods particularly pointed out in the written description and claims thereof, as well as from the appended drawings.

The present invention addresses such issues, and an object thereof is to provide flux, resin flux cored solder using the flux, and a soldering method.

Inventors have found out that volatile rosin allows the flux to have predetermined viscosity, it has a character which is hard to volatilize at heating up to a temperature range estimated in soldering to guard an activator and to reduce the viscosity and to be flown, and it is volatile at a heat history estimated in the soldering and suppresses carbonization by the successive heating.

To address the issues and achieve other advantages in accordance with the object of the illustrated embodiments, in one aspect, described is flux for resin flux cored solder using in a soldering method in which the resin flux cored solder is supplied into a through hole formed along a central axis of a soldering iron, the soldering iron is heated up to a temperature exceeding a melting point of the resin flux cored solder to heat a joint target, the resin flux cored solder is melted and the soldering iron is released from the joint target. This flux for resin flux cored solder contains volatile rosin in an amount of 70 wt % or more and 98 wt % or less; non-volatile rosin in an amount of 0 wt % or more and 10% or less; and an activator in an amount of 2 wt % or more and 30 wt % or less, the activator including an organic acid in an amount of 0 wt % or more and 15 wt % or less, an organohalogen compound in an amount of 0.5 wt % and 15 wt % or less, an amine in an amount of 0 wt % or more and 5 wt % or less, and an amine hydrohalide salt in an amount of 0 wt % or more and 2.5 wt % or less, wherein weight of the flux for resin flux cored solder after heating the flux for resin flux cored solder in an amount of 10 mg under $N_2$ atmosphere from 25 degrees C. to 350 degrees C. at a temperature rising speed of 10 degrees C./min is 20% or less of the weight of the flux for resin flux cored solder before the heating.

In addition, in other aspect, described is resin flux cored solder using the flux. Further, in another aspect, described is a soldering method including steps of supplying flux and resin flux cored solder, in which the flux is filled, into a through hole formed along a central axis of a soldering iron, the flux containing volatile rosin in an amount of 70 wt % or more and 98 wt % or less, non-volatile rosin in an amount of 0 wt % or more and 10% or less, and an activator in an amount of 2 wt % or more and 30 wt % or less, the activator including an organic acid in an amount of 0 wt % or more and 15 wt % or less, an organohalogen compound in an amount of 0.5 wt % and 15 wt % or less, an amine in an amount of 0 wt % or more and 5 wt % or less, and an amine hydrohalide salt in an amount of 0 wt % or more and 2.5 wt % or less, heating the soldering iron up to a temperature exceeding a melting point of the resin flux cored solder to heat a joint target, melting the resin flux cored solder, and releasing the soldering iron from the joint target, wherein weight of the flux for resin flux cored solder after heating the flux for resin flux cored solder in an amount of 10 mg under $N_2$ atmosphere from 25 degrees C. to 350 degrees C. at a temperature rising speed of 10 degrees C./min is 20% or less of the weight of the flux for resin flux cored solder before the heating.

BRIEF DESCRIPTION OF THE DRAWINGS

The accompanying drawings illustrate various non-limiting, example, inventive aspects in accordance with the present disclosure:

FIG. 1 depicts one example of a soldering iron used in a soldering method of the embodiments according to the present invention;

FIG. 2A depicts a soldering method of the embodiments according to the present invention;

FIG. 2B depicts the soldering method of the embodiments according to the present invention;

FIG. 2C depicts the soldering method of the embodiments according to the present invention; and FIG. 2D depicts the soldering method of the embodiments according to the present invention.

DETAILED DESCRIPTION OF THE PREFERRED EMBODIMENTS

Other objects and attainments of the present invention will be become apparent to those skill in the art upon a reading of the following detailed description.

The illustrated embodiments are now described more fully with reference to the accompanying drawings where like reference numerals identify similar structure/functional features. The illustrated embodiments are not limited in any way to what is illustrated as the illustrated embodiments described below are merely exemplary, which can be embodied in various forms, as appreciated by one skilled in the art. Therefore, it is to be understood that any structural and functional details disclosed herein are not to be interpreted as limiting, but merely as a basis for the claims and as a representation for teaching one skill in the art to variously employ the discussed embodiments. Furthermore, the terms and phrases used herein are not intended to be limiting but rather to provide an understandable description of the illustrated embodiments.

Unless defined otherwise, all technical and scientific terms used herein have the same meaning as commonly understood by one of ordinally skill in the art to which the invention belongs. Although any methods and materials similar or equivalent to those described herein can also be used in the practice or testing of the illustrated embodiments, exemplary methods and materials are now described.

It must be noted that as used herein and in the appended claims, the singular forms "a", "an" and "the" include plural referents unless the context clearly dictates otherwise.

<One Example of Flux in the Embodiments According to the Present Invention>

Flux for resin flux cored solder in each of these embodiments contains volatile rosin or the volatile rosin and non-volatile rosin, and an activator. The flux for resin flux cored solder will be collectively called as "flux" in the following description.

The flux containing the volatile rosin or the volatile rosin and the non-volatile rosin is a solid or has predetermined viscosity so as to be not flown out, at room temperature. The volatile rosin, which has a boiling point near the temperature range estimated in the soldering, has volatility by their heat history estimated in the soldering. The flux containing the volatile rosin or the volatile rosin and the non-volatile rosin has a function to remove any metal oxides by containing an activator such as organohalogen compound. The rosin may also have a function as the activator. Accordingly, the flux containing such rosin has a function to prevent contents of other activator such as the organic acid from being increased and to remove any metal oxides.

In the resin flux cored solder in which the flux is filled in the solder, the flux is required to have predetermined viscosity in order to prevent the flux from being flown out of the solder. In a case where the flux according to each of the embodiments is applied to the resin flux cored solder, when an amount of the volatile rosin is small, an amount of the non-volatile rosin is required to be increased in order to maintain the viscosity thereof. The non-volatile rosin, however, has refractory in the heating up to the temperature range estimated in the soldering, and behaves to represent much residue when increasing the amount of the non-volatile rosin, so that it is not suitable for an application of low residue.

Therefore, the flux according to each of the embodiments contains the volatile rosin in an amount of 70 wt % or more and 98 wt % or less, the non-volatile rosin in an amount of 0 wt % or more and 10% or less, and an activator in an amount of 2 wt % or more and 30 wt % or less. The flux according to each of the embodiments is preferable so as to be a solid or a liquid having viscosity of 3500 Pa·s or more, at 25 degrees C. Weight of the flux after heating the flux in an amount of 10 mg under $N_2$ atmosphere from 25 degrees C. to 350 degrees C. at a temperature rising speed of 10 degrees C./min is 20% or less of the weight thereof before the heating. In addition, it is preferable that the weight of the flux after heating the flux in an amount of 10 mg under $N_2$ atmosphere from 25 degrees C. to 350 degrees C. at a temperature rising speed of 10 degrees C./min is 15% or less of the weight thereof before the heating.

As the volatile rosin, for example, exemplified are hydrogenated rosins, hydrogenated and disproportionated rosins, acrylic acid modified and hydrogenated rosins, acrylic acid modified rosins, natural rosins, disproportionated rosins and the like, which are derivatives obtained from the natural rosins such as gum rosin, wood rosin, and tall oil rosin. Any one or two species or more of these materials can be used. As the volatile rosin, any of the hydrogenated rosins, the hydrogenated and disproportionated rosins, and the acrylic acid modified and hydrogenated rosins or a combination of these rosins may be preferably used.

As the non-volatile rosin, for example, exemplified are polymerized rosins, acid modified rosins, phenol modified rosins, and α, β unsaturated carboxylic acid modified products (acrylated rosins, maleated rosins, fumarated rosins, and the like), which are derivatives obtained from the natural rosins such as gum rosin, wood rosin, and tall oil rosin, purified products, hydrides, and disproportionated products of the polymerized rosins, esterified products and purified products, hydrides, and disproportionated products of the α,β-unsaturated carboxylic acid modified products. Any one or two species or more of these materials can be used.

The flux according to each of the embodiments may contain resin such as acrylic resin other than the volatile rosin and the non-volatile rosin, in addition to the volatile rosin and the non-volatile rosin. As the other resin, at least one resin selected from the group of acrylic resin, terpene resin, modified terpene resin, terpene phenol resin, modified terpene phenol resin, styrene resin, modified styrene resin, xylene resin, modified xylene resin, polyethylene, polypropylene, polyvinyl acetate, polyvinyl alcohol, polyethylene-polypropylene copolymer and polyethylene-polyvinyl acetate copolymer may be further contained. As the modified terpene resin, aromatic modified terpene resin, hydrogenated terpene resin, hydrogenated aromatic modified terpene resin, or the like may be used. As the modified terpene phenol resin, hydrogenated terpene phenol resin may be used. As the modified styrene resin, styrene acrylic resin, styrene maleic acid resin or the like may be used. As the modified xylene resin, phenol modified xylene resin, alkyl phenol modified xylene resin, phenol modified resol-type xylene resin, polyol modified xylene resin, polyoxyethylene-added xylene resin or the like may be used. In addition, the amount of the other resin is 15 wt % or less of the volatile rosin and the non-volatile rosin, preferably 10 wt % or less, more preferably 5 wt % or less when a total amount of the volatile rosin and the non-volatile rosin is 100.

The activator in the flux according to each of the embodiments includes an organic acid, an amine, an amine hydrohalide salt, and an organohalogen compound. As the activator, the organic acid in an amount of 0 wt % or more and 15 wt % or less, the organohalogen compound in an amount of 0.5 wt % or more and 15 wt % or less, the amine in an amount of 0 wt % or more and 5 wt % or less, the amine hydrohalide salt in an amount of 0 wt % or more and 2.5 wt % or less are contained. The organic acid in an amount of 0.1 wt % or more and 15 wt % or less may be preferably contained; the organic acid in an amount of 0.5 wt % or more and 15 wt % or less may be more preferably contained; and the organic acid in an amount of 1.0 wt % or more and 15 wt % or less may be most preferably contained. The organohalogen compound in an amount of 1.0 wt % or more and 15 wt % or less may be preferably contained.

As the organic acid, exemplified are glutaric acid, adipic acid, pimelic acid, azelaic acid, eicosane diacid, citric acid, glycolic acid, succinic acid, salicylic acid, diglycolic acid, dipicolinic acid, dibutyl aniline diglycolic acid, suberic acid, sebacic acid, thioglycol acid, phthalic acid, isophthalic acid, terephthalic acid, dodecanedioic acid, parahydroxyphenylacetic acid, picolinic acid, phenylsuccinic acid, fumaric acid, maleic acid, malonic acid, lauric acid, benzoic acid, tartaric acid, tris(2-carboxyethyl)isocyanurate, glycine, 1,3-cyclohexanedicarboxylic acid, 2,2-bis(hydroxymethyl)propionic acid, 2,2-bis(hydroxymethyl)butanoic acid, 4-tert-butyl benzoic acid, 2,3-dihydroxybenzoic acid, 2,4-diethyl glutaric acid, 2-quinolinecarboxylic acid, 3-hydroxybenzoic acid, malic acid, p-anisic acid, palmitic acid, stearic acid, 12-hydroxystearic acid, oleic acid, linoleic acid, linolenic acid and the like.

Further, as the organic acid, exemplified are dimer acid which is a reactant of oleic acid and linoleic acid, trimer acid which is a reactant of oleic acid and linoleic acid, hydrogenated dimer acid that is obtained by adding hydrogen to the dimer acid which is a reactant of oleic acid and linoleic acid, hydrogenated trimer acid that is obtained by adding hydrogen to the trimer acid which is a reactant of oleic acid and linoleic acid and the like. Additionally, as for the organic acid, as the dimer acid other than the dimer acid which is a reactant of oleic acid and linoleic acid, the trimer acid other than the trimer acid which is a reactant of oleic acid and linoleic acid, the hydrogenated dimer acid that is obtained by adding hydrogen to dimer acid other than the dimer acid which is a reactant of oleic acid and linoleic acid, and hydrogenated trimer acid that is obtained by adding hydrogen to trimer acid other than the trimer acid which is a reactant of oleic acid and linoleic acid, exemplified are dimer acid which is a reactant of acrylic acid, trimer acid which is a reactant of acrylic acid, dimer acid which is a reactant of methacrylic acid, trimer acid which is a reactant of methacrylic acid, dimer acid which is a reactant of acrylic acid and methacrylic acid, trimer acid which is a reactant of acrylic acid and methacrylic acid, dimer acid which is a reactant of oleic acid, trimer acid which is a reactant of oleic acid, dimer acid which is a reactant of linoleic acid, trimer acid which is a reactant of linoleic acid, dimer acid which is a reactant of linolenic acid, trimer acid which is a reactant of linolenic acid, dimer acid which is a reactant of acrylic acid and oleic acid, trimer acid which is a reactant of acrylic acid and oleic acid, dimer acid which is a reactant of acrylic acid and linoleic acid, trimer acid which is a reactant of acrylic acid and linoleic acid, dimer acid which is a reactant of acrylic acid and linolenic acid, trimer acid which is a reactant of acrylic acid and linolenic acid, dimer acid which is a reactant of methacrylic acid and oleic acid, trimer acid which is a reactant of methacrylic acid and oleic acid, dimer acid which is a reactant of methacrylic acid and linoleic acid, trimer acid which is a reactant of methacrylic acid and linoleic acid, dimer acid which is a reactant of methacrylic acid and linolenic acid, trimer acid which is a reactant of methacrylic acid and linolenic acid, dimer acid which is a reactant of oleic acid and linolenic acid, trimer acid which is a reactant of oleic acid and linolenic acid, dimer acid which is a reactant of linoleic acid and linolenic acid, trimer acid which is a reactant of linoleic acid and linolenic acid, hydrogenated dimer acid which is obtained by adding hydrogen to dimer acid other than the dimer acid which is a reactant of the oleic acid and linoleic acid as described above, hydrogenated trimer acid which is obtained by adding hydrogen to trimer acid other than the trimer acid which is a reactant of the oleic acid and linoleic acid as described above, and the like.

As the organohalogen compound, exemplified are trans-2,3-dibromo-1,4-butenediol, triallyl isocyanurate hexabromide, 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, 2,3-dibromo-2-butene-1,4-diol, trans-2,3-dibromo-2-buten-1,4-diol, cis-2,3-dibromo-2-butene-1,4-diol, 2,2-bis(bromomethyl)-1,3-propanediol, tetrabromoethane, tetrabromobutane, tetrabromophthal acid, bromosuccinic acid, 2,2,2-tribromoethanol, and the like, which are organobromo compounds. In addition, exemplified are choroalkane, chlorinated fatty acid ester, HET acid, HET acid nonhydrate, and the like, which are organochlorine compounds. Additionally, exemplified are fluorochemical surfactant, surfactant including a perfluoroalkyl group, polytetrafluoroethylene and the like, which are organofluoro compounds.

As the amine, exemplified are monoethanolamine, diphenylguanidine, ethylamine, triethylamine, ethylenediamine, triethylenetetramine, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo [1,2-a]benzimidazole, 1-dodecyl-2-methyl-3-benzylimidazolium chloride, 2-methylimidazoline, 2-phenylimidazoline, 2,4-diamino-6-vinyl-s-triazine, 2,4-diamino-6-vinyl-s-triazine isocyanuric acid adduct, 2,4-diamino-6-methacryloyloxyethyl-s-triazine, epoxy-imidazole adduct, 2-methylbenzimidazole, 2-octylbenzimidazole, 2-pentylbenzimidazole, 2-(1-ethylpentyl)benzimidazole, 2-nonylbenzimidazole, 2-(4-thiazolyl)benzimidazole, benzimidazole, 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-amylphenyl)benzotriazole, 2-(2'-hydroxy-5'-tert-octylphenyl)benzotriazole, 2,2'-methylenebis[6-(2H-benzotriazol-2-yl)-4-tert-octylphenol], 6-(2-benzotriazolyl)-4-tert-octyl-6'-tert-butyl-4'-methyl-2, 2'-methylene bisphenol, 1,2,3-benzotriazole, 1-[N,N-bis(2-ethylhexyl)aminomethyl]benzotriazole, carboxybenzotriazole, 1-[N,N-bis(2-ethylhexyl)aminomethyl]methyl benzotriazole, 2,2'-[[(methyl-1H-benzotriazol-1-yl)methyl]imino]bisethanol, 1-(1',2'-dicarboxyethyl)benzotriazole, 1-(2,3-dicarboxypropyl)benzotriazole, 1-[(2-ethylhexylamino) methyl]benzotriazole, 2,6-bis [(1H-benzotriazol-1-yl)methyl]-4-methylphenol, 5-methyl benzotriazole, 5-phenyltetrazole and the like.

The amine hydrohalide salt is a compound obtained by causing an amine and hydrogen halide to react, and aniline hydrochloride, aniline hydrobromide, and the like are exemplified. As the amine of the amine hydrohalide salt, the above-described amines can be used, and ethylamine, ethylenediamine, triethylamine, methylimidazole, 2-ethyl-4-methylimidazole, and the like are exemplified. As the hydrogen halide, hydrides of chlorine, bromine, iodine, and fluorine (hydrogen chloride, hydrogen bromide, hydrogen iodide, and hydrogen fluoride) are exemplified. Moreover, borfluoride may be contained in place of, or in combination with the amine hydrohalide salt, and as the borfluoride, fluoroboric acid and the like are exemplified.

Further, when the organic acid and the amine are added to the flux, a predetermined amount of the organic acid and the amine is reacted with each other to be their salts. Therefore, the reaction of the organic acid and the amine may be inhibited by adding two species or more of the organic acid and the amine after they are reacted with each other to be their salts.

The flux according to each of the embodiments may contain a solid solvent in an amount of 0 wt % or more and 30 wt % or less. As the solid solvent, neopentyl glycol (2,2-dimethyl-1,3-propanediol), dioxane glycol or the like is exemplified. The flux according to each of the embodiments may contain at least one of these solid solvents.

In addition, the flux according to each of the embodiments contains, as the additive, silicon in an amount of 0 wt % or more and 1 wt % or less, phosphoric acid ester in an amount of 0 wt % or more and 1 wt % or less, and a surfactant in an amount of 0 wt % or more and 1 wt % or less. It may also contain an antifoam agent and coloring material.

As the silicon, exemplified are dimethyl silicon oil, cyclic silicon oil, methyl phenyl silicon oil, methyl hydrogen silicon oil, higher fatty acid denatured silicon oil, alkyl denatured silicon oil, alkyl aralkyl denatured silicon oil, amino denatured silicon oil, epoxy denatured silicon oil, polyether denatured silicon oil, alkyl polyether denatured silicon oil, carbinol denatured silicon oil, and the like.

As the phosphoric acid ester, exemplified are methyl acid phosphate, ethyl acid phosphate, isopropyl acid phosphate, monobutyl acid phosphate, butyl acid phosphate, dibutyl acid phosphate, butoxyethyl acid phosphate, 2-ethylhexy acid phosphate, bis(2-ethylhexy) phosphate, monoisodecyl acid phosphate, isodecyl acid phosphate, lauryl acid phosphate, isotridecyl acid phosphate, stearyl acid phosphate, oleyl acid phosphate, beef tallow phosphate, coconut oil phosphate, isostearyl acid phosphate, alky acid phosphate, tetracosyl acid phosphate, ethylene glycol acid phosphate, 2-hydroxyethyl methacrylate acid phosphate, dibutyl pyrophosphate acid phosphate, 2-ethylhexylphosphonic acid mono-2-ethylhexyl, alkyl(alkyl)phosphonate, and the like.

As the surfactant, exemplified are acrylic polymer, vinyl ether polymer, olefin polymer, butadiene polymer, and the like.

<Configuration Example of Resin Flux Cored Solder According to the Embodiments>

The resin flux cored solder according to each of the embodiments has a wire shape in which the flux as described above is filled but in addition to that, may have any shape of column such as cylindric shape called as a pellet, a disk, a ring, a chip, a ball, and a column. The flux used for the resin flux cored solder is required to be a solid at a room temperature in order to prevent the flux from being flown out thereof in a solder-forming step or to have predetermined high viscosity so as to prevent it from being flown out thereof. The viscosity required for the flux in a case where it is used in the resin flux cored solder is 3500 Pa·s or more, for example. A diameter of the resin flux cored solder is 0.1 mm or more and 1.6 mm or less, preferably 0.3 mm or more and 1.3 mm or less, more preferably 0.6 mm or more and 1.0 mm or less. Moreover, the content of the flux filled in the resin flux cored solder is 0.5 wt % or more and 6 wt % or less, preferably 1.5 wt % or more and 4.5 wt % or less, and more preferably 2.0 wt % or more and 4.0 wt % or less when a total amount of the resin flux cored solder is 100.

The solder is configured to be Sn alone, Sn—Ag based alloy, Sn—Cu based alloy, Sn—Ag—Cu based alloy, Sn—Bi based alloy, Sn—In based alloy, Sn—Zn based alloy, Sn—Pb based alloy or the like, or an alloy in which Sb, Bi, In, Cu, Zn, As, Ag, Cd, Fe, Ni, Co, Au, Ge, Ga, Al, Mn, Ti, P, Pb, Zr or the like is added to any of these alloys.

<Effects of Flux and Resin Flux Cored Solder According to Embodiments>

The flux containing the volatile rosin or the volatile rosin and the non-volatile rosin behaves so as to be a solid or have predetermined viscosity, at room temperature.

In addition, by containing an activator in the flux, the flux has a sufficient activation to the metal oxide, and the volatile rosin and the non-volatile rosin are flown based on deterioration of their viscosities in the course of heating up to the temperature range exceeding the melting point of the solder.

Therefore, the flux according to each of the embodiments is available for the resin flux cored solder, thereby enabling sufficient activity to remove the metal oxides to be obtained. Since the flux is not flown at room temperature, it is preferably applied to the flux for the resin flux cored solder. Further, the volatile rosin has volatility in a heat history estimated in the soldering, so that it is preferably applied to an application for low residue.

In addition, by containing a predetermined amount of the organohalogen compound as the activator, the flux can have a sufficient activation without increasing content of the amine hydrohalide salt as the activator, thereby improving corrosion resistance. Further, since the organohalogen compound is halogenated, the organohalogen compound does not demonstrate any activator effect at a room temperature and behaves stable but the organohalogen compound is decomposed by the heating in the course of the soldering to demonstrate an activator effect, so that the flux according to each of the embodiments behaves more stable at a room temperature than the flux to which an organic acid is added.

<One Example of Soldering Method According to Embodiments>

FIG. 1 depicts one example of a soldering iron used in the soldering method according to each of the embodiments and FIGS. 2A, 2B, 2C and 2D depict the soldering method according to each of the embodiments.

The soldering method according to each of the embodiments is applied to a through-hole technology, a single-sided board and the like. In the soldering iron 1A used in the soldering method according to each of the embodiments, a through hole 2 is formed along a central axis of the soldering iron 1A and a heater 3 is provided as heating means for heating the soldering iron 1A.

In the soldering iron 1A, a diameter D of the through hole 2 is greater than a diameter $d_1$ of the resin flux cored solder H, so that the resin flux cored solder H can be supplied to a tip 10 of the soldering iron 1A via the through hole 2. In addition, in the soldering iron 1A, the diameter D of the through hole 2 is greater than a diameter $d_2$ of a lead terminal 101 of an electronic component 100, so that the lead terminal 101 can be inserted to the tip 10 of the through hole 2.

In the soldering method according to the embodiments, as shown in FIG. 2A, the lead terminal 101 of the electronic component 100 is inserted to a through hole 201 formed in a substrate 200. The heater 3 also heats the soldering iron 1A up to temperature exceeding the melting point of the solder and the soldering iron 1A is controlled so as to be kept at a predetermined temperature which exceeding the melting point of the solder. The tip 10 of the soldering iron 1A then contacts or approaches the through hole 201 to which the lead terminal 101 has been inserted, as shown in FIG. 2B, so that the lead terminal 101 is inserted to the through hole 2 of the soldering iron 1A.

Next, the resin flux cored solder H cut to a predetermined length is supplied to the through hole 2 of the soldering iron 1A, thereby enabling the resin flux cored solder H to contact the lead terminal 101 inserted to the through hole 2.

By controlling the soldering iron 1A so as to be kept at the predetermined temperature exceeding the melting point of the solder, the resin flux cored solder H is heated and melted, as shown in FIG. 2C, and the through hole 201 and the lead terminal 101 are heated.

When heating the resin flux cored solder H with the soldering iron 1A up to the temperature exceeding the melting point of the solder, the viscosity of the flux in the resin flux cored solder is deteriorated, so that the flux is flown to the through hole 201 and the lead terminal 101, thereby enabling any metal oxides on surfaces of the solder, the through hole 201 and the lead terminal 101 to be removed and the molten solder is wetly spread.

Next, as shown in FIG. 2D, by releasing the soldering iron 1A from the through hole 201, the solder wetly spread in the through hole 201 and the lead terminal 101 is hardened.

In a case where the flux used in the resin flux cored solder H in the soldering method as described above is the flux according to each of the embodiments, the flux contains the volatile rosin or the volatile rosin and non-volatile rosin, so that the flux can be a solid or have predetermined high viscosity. Therefore, it is preferable to the flux for the resin flux cored solder.

In addition, the volatile rosin has volatility in a heat history estimated in the soldering. On the other side, when containing the non-volatile rosin in an amount of 10 wt % or less, even if containing the non-volatile rosin, the flux can be a solid or have predetermined high viscosity, so that the content of the non-volatile rosin can be reduced.

This allows to be restrained an amount of residue after being heated of the flux in the resin flux cored solder H supplied to the through hole 2 of the soldering iron 1A. Even when the resin flux cored solder H is supplied to the through hole 2 and the soldering is successively performed in a controlled manner to keep the soldering iron 1A at the predetermined temperature exceeding the melting point of the solder, it is possible to restrain carbide of the residue from being accumulated in the through hole 2, and restrain any failure such that the through hole 2 of the soldering iron 1A is stuffed by the carbide of the residue from occurring.

EXECUTED EXAMPLES

The flux of each of the Executed Examples and the Comparative Examples was prepared with each of the compositions shown in following Tables 1 through 6 below and amounts of their residues, wet-spreading property of the solder, corrosion resistance, and processabilities were verified. The composition rates in Tables 1 through 6 have been expressed in wt (weight) % when the total amount of the flux is 100.

<Evaluation of Amount of Residue>

(1) Verification Method

As the test evaluation method according to TG method (thermogravimetry), the flux of each of the Executed Examples in an amount of 10 mg and the flux of each of the Comparative Examples in an amount of 10 mg were respectively filled in aluminum pans and were heated from 25 degrees C. to 350 degrees C. at a temperature rising rate of 10 degrees C./min under $N_2$ atmosphere using TGD9600 manufactured by ULVAC corporation. It was measured whether or not weight of each flux after heating showed 20% or less of that before the heating.

(2) Criterion for Determination

⊚: The weight of flux after heating showed 15% or less of that before the heating.

○: The weight of flux after heating showed a weight exceeding 15% but 20% or less of that before the heating.

x: The weight of flux after heating showed a weight exceeding 20% of that before the heating.

It is said that in the flux showing that the weight of flux after heating showed 20% or less of that before the heating, components in the flux are sufficiently volatilized by the heating. It is said that in the flux showing that the weight of flux after heating showed 15% or less of that before the heating, components in the flux are more sufficiently volatilized by the heating. It is said that in the flux showing that the weight of flux after heating showed a weight exceeding 20% of that before the heating, components in the flux are not sufficiently volatilized by the heating. When the flux which is not sufficiently volatilized is used for the resin flux cored solder and is applied to the soldering method described above, a large amount of the residue is accumulated in the through hole of the solder iron, which causes any failure such that the resin flux cored solder cannot be normally supplied to the through hole.

<Evaluation of Wet-Spreading Property of Solder>
(1) Verification Method

For the evaluation of wet-spreading properties of the resin flux cored solders, the resin flux cored solders using the fluxes of the Executed Examples and the fluxes of the Comparative Examples were prepared as specimens. Each of the resin flux cored solders had composition of Sn-3Ag-0.5Cu containing Ag in amount of 3.0 wt %, Cu in an amount of 0.5 wt % and the remainder of Sn. Each of the resin flux cored solders had a diameter of 0.8 mm. Each of the resin flux cored solders contained solder in amount of 97 wt % and flux in amount of 3 wt % when the total amount of the flux is 100. Using these resin flux cored solders, their wet-spreading rates were calculated conforming to JIS Z 3197 8.3.1.1.

(2) Criterion for Determination
○: The resin flux cored solder showed wet-spreading rate of 70% or more.
X: The resin flux cored solder showed wet-spreading rate of less than 70%.

<Evaluation of Processabilities>
(1) Verification Method

The flux of each of the Executed Examples and the flux of each of the Comparative Examples were prepared as specimens and their states at 25 degrees C. were observed, so that it was determined that each flux was either a solid or a liquid. When the flux was a liquid, the flux was put between plates of a rheometer (Thermo Scientific HAAKE MARS III (trade mark)) and then, these plates were rotated at 6 Hz to measure viscosity of the flux. The processabilities thereof when manufacturing the resin flux cored solders were evaluated on the basis of criterion shown below.

(2) Criterion for Determination
○: The state of the flux was a solid at 25 degrees C. Alternatively, the state thereof was a liquid at 25 degrees C. but the viscosity measured by the rheometer was 3500 Pa·s or more. When the state of the flux was a solid at 25 degrees C. or the state thereof was a liquid at 25 degrees C. but the viscosity thereof measured by the rheometer was 3500 Pa·s or more, the resin flux cored solder using the flux could be made.
X: The state of the flux was a liquid at 25 degrees C. and the viscosity thereof measured by the rheometer was less than 3500 Pa·s. When the state of the flux was a liquid at 25 degrees C. and the viscosity thereof measured by the rheometer was less than 3500 Pa·s, the flux was flown out and the resin flux cored solder using the flux could not be made.

<Evaluation of Corrosion Resistance>
(1) Verification Method

The flux of each of the Executed Examples and the flux of each of the Comparative Examples were prepared as specimens and they were tested in a corrosion test using a copper mirror based on JIS Z 3197. Their corrosion degrees of flux-applied portions in the copper mirror specimens were evaluated by transmittance.

(2) Criterion for Determination
○: The copper mirror specimen showed transmittance of 50% or less.
x: The copper mirror specimen showed transmittance exceeding 50%.

<Total Evaluation>
○: ○ or ◉ mark was indicated in the evaluation of the amount of residue and ○ mark was indicated in all of the evaluations for the wet-spreading property of solder, the processabilities, and the corrosion resistance.
x: x mark(s) was(were) indicated in any or all of the evaluations of the amount of residue, the wet-spreading property of solder, the processabilities, and the corrosion resistance.

TABLE 1

| Material Category | | Material Name | Executed Example 1 | Executed Example 2 | Executed Example 3 | Executed Example 4 | Executed Example 5 | Executed Example 6 | Executed Example 7 | Executed Example 8 | Executed Example 9 | Executed Example 10 |
|---|---|---|---|---|---|---|---|---|---|---|---|---|
| Rosins | Volatile rosins | Hydrogenated rosins | 94 | 91.5 | 92 | 92.5 | 93 | 93.5 | 96 | 92 | 90 | 87 |
| | | Hydrogenated and disproportionated rosins | | | | | | | | | | |
| | | Acrylic acid modified and hydrogenated rosins | | | | | | | | | | |
| | | Natural rosins | | | | | | | | | | |
| | | Disproportionated rosins | | | | | | | | | | |
| | | Acrylic acid modified rosins | | | | | | | | | | |
| | | Polymerized rosins | | | | | | | | | | |
| | Non-volatile rosins | Rosin ester | | | | | | | | | | |
| | | Phenol modified rosins | | | | | | | | | | |
| Solvents | Solid solvents | Neopentyl glycol | | | | | | | | | | |
| Activators | Organic acids | Adipic acid | | | | | | | | | | |
| | | Pimelic acid | | | | | | | | | | |
| | | Suberic acid | | | | | | | | | | |
| | | Dodecanedioic acid | 3 | 3 | 3 | 3 | 3 | 3 | 3 | 3 | 3 | 3 |
| | | Glutaric acid | | | | | | | | | | |
| | | 2-phenylimidazole | | | | | | | | | | |
| | Amine hydrohalide salt | N, N-diethylaniline hydrobromate | | 2.5 | 2 | 1.5 | 1 | 0.5 | | | | |
| | Organohalogen compound | 2,2,2-tribromoethanol | 3 | 3 | 3 | 3 | 3 | 3 | 1 | 5 | 7 | 10 |
| | | Trans-2,3-dibromo-2-buten-1,4-diol | | | | | | | | | | |
| | | 2,3-dibromo-1,4-butanediol | | | | | | | | | | |
| | | Triallyl isocyanurate hexabromide | | | | | | | | | | |
| | | Tetrabromoethan | | | | | | | | | | |
| | | Tetrabromobutane | | | | | | | | | | |
| | | 2,2-bis(bromomethyl)-1,3-propanediol | | | | | | | | | | |
| Additives | Silicon | Dimethyl silicon oil | | | | | | | | | | |
| | | Methyl phenyl silicon oil | | | | | | | | | | |
| | | Cyclic silicon oil | | | | | | | | | | |
| | Phosphoric acid ester | Isodecyl acid phosphate | | | | | | | | | | |
| | Surfactant | Acrylic polymer | | | | | | | | | | |
| | | Vinyl ether polymer | | | | | | | | | | |
| | | Olefin polymer | | | | | | | | | | |
| | | Butadiene polymer | | | | | | | | | | |
| Total | | | 100 | 100 | 100 | 100 | 100 | 100 | 100 | 100 | 100 | 100 |
| Evaluation of Amount of Residue | | | ◎ | ◎ | ◎ | ◎ | ◎ | ◎ | ◎ | ◎ | ◎ | ◎ |
| Evaluation of Wet-spreading Property of Solder | | | ○ | ○ | ○ | ○ | ○ | ○ | ○ | ○ | ○ | ○ |
| Evaluation of Corrosion Resistance | | | ○ | ○ | ○ | ○ | ○ | ○ | ○ | ○ | ○ | ○ |
| Evaluation of Processabilities (Viscosity) | | | ○ | ○ | ○ | ○ | ○ | ○ | ○ | ○ | ○ | ○ |
| Total Evaluation | | | ○ | ○ | ○ | ○ | ○ | ○ | ○ | ○ | ○ | ○ |

TABLE 2

| Material Category | Material Name | Executed Example 11 | Executed Example 12 | Executed Example 13 | Executed Example 14 | Executed Example 15 | Executed Example 16 | Executed Example 17 | Executed Example 18 |
|---|---|---|---|---|---|---|---|---|---|
| Rosins | Volatile rosins | Hydrogenated rosins | 92 | 92 | 92 | 92 | 92 | 92 | 37 | 86 |
| | | Hydrogenated and disproportionated rosins | | | | | | | | |
| | | Acrylic acid modified and hydrogenated rosins | | | | | | | | |
| | | Natural rosins | | | | | | | | |
| | | Disproportionated rosins | | | | | | | | |
| | | Acrylic acid modified rosins | | | | | | | | |
| | | Polymerized rosins | | | | | | | | |
| | Non-volatile rosins | Rosin ester | | | | | | | | |
| | | Phenol modified rosins | | | | | | | | |
| Solvents | Solid solvents | Neopentyl glycol | | | | | | | | |
| Activators | Organic acids | Adipic acid | | | | | | | | |
| | | Pimelic acid | | | | | | | | |
| | | Suberic acid | | | | | | | | |
| | | Dodecanedioic acid | 3 | 3 | 3 | 3 | 3 | 3 | 3 | 3 |
| | | Glutaric acid | | | | | | | | |
| | | 2-phenylimidazole | | | | | | | | |
| | Amine Amine hydrohalide salt | N,N-diethylaniline hydrobromate | 5 | | | | | | | |
| | Organohalogen compound | 2,2,2-tribromoethanol | | | | | | | | |
| | | Trans-2,3-dibromo-2-buten-1,4-diol | | 5 | | | | | | |
| | | 2,3-dibromo-1,4-butanediol | | | | | | | | |
| | | Triallyl isocyanurate hexabromide | | | 5 | | | | | |
| | | Tetrabromoethan | | | | 5 | | | | |
| | | Tetrabromobutane | | | | | 5 | | | |
| | | 2,2-bis(bromomethyl)-1,3-propanediol | | | | | | 5 | | |
| Additives | Silicon | Dimethyl silicon oil | | | | | | | 1.5 | 1 |
| | | Methyl phenyl silicon oil | | | | | | | 1.5 | 1.5 |
| | | Cyclic silicon oil | | | | | | | 1.5 | 1.5 |
| | Phosphoric acid ester | Isodecyl acid phosphate | | | | | | | 1.5 | 1.5 |
| | Surfactant | Acrylic polymer | | | | | | | 1.5 | 1.5 |
| | | Vinyl ether polymer | | | | | | | 1.5 | 1.5 |
| | | Olefin polymer | | | | | | | 1 | 1.5 |
| | | Butadiene polymer | | | | | | | | 1 |
| | | Total | 100 | 100 | 100 | 100 | 100 | 100 | 100 | 100 |
| | | Evaluation of Amount of Residue | ◎ | ◎ | ◎ | ◎ | ◎ | ◎ | ◎ | ◎ |
| | | Evaluation of Wet-spreading Property of Solder | ○ | ○ | ○ | ○ | ○ | ○ | ○ | ○ |
| | | Evaluation of Corrosion Resistance | ○ | ○ | ○ | ○ | ○ | ○ | ○ | ○ |
| | | Evaluation of Processabilities (Viscosity) | ○ | ○ | ○ | ○ | ○ | ○ | ○ | ○ |
| | | Total Evaluation | ○ | ○ | ○ | ○ | ○ | ○ | ○ | ○ |

TABLE 3

| Material Category | | Material Name | Executed Example 19 | Executed Example 20 | Executed Example 21 | Executed Example 22 | Executed Example 23 | Executed Example 24 | Executed Example 25 | Executed Example 26 | Executed Example 27 | Executed Example 28 | Executed Example 29 |
|---|---|---|---|---|---|---|---|---|---|---|---|---|---|
| Rosins | Volatile rosins | Hydrogenated rosins | 87 | | | | | | | | 70 | 98 | 98 |
| | | Hydrogenated and disproportionated rosins | | 87 | | | | | | | | | |
| | | Acrylic acid modified and hydrogenated rosins | | | 87 | | | | 27 | | 10 | | |
| | | Natural rosins | | | | | | | 30 | 12 | | | |
| | Non-volatile rosins | Disproportionated rosins | | | | 87 | | | 30 | 15 | | | |
| | | Acrylic acid modified rosins | | | | | 87 | | | 15 | | | |
| | | Polymerized rosins | | | | | | 87 | | 15 | | | |
| | | Rosin ester | | | | | | | | 15 | | | |
| | | Phenol modified rosins | | | | | | | | 15 | | | |
| Solvents | Solid solvents | Neopentyl glycol | 10 | | | | | | | | | | |
| Activators | Organic acids | Adipic acid | | 10 | | | | | | | | | |
| | | Pimelic acid | | | 10 | | | | | | | | |
| | | Suberic acid | | | | | | | | | | | |
| | | Dodecanedioic acid | | | | | 10 | 10 | 10 | 10 | | | |
| | | Glutaric acid | | | | 10 | | | | | | | |
| | Amine | 2-phenylimidazole | 3 | 3 | 3 | 3 | 3 | 3 | 3 | 3 | 10 | | |
| | Amine hydrohalide salt | N, N-diethylaniline hydrobromate | | | | | | | | | | | |
| | Organohalogen compound | 2,2,2-tribromoethanol | | | | | | | | | | 1 | 1 |
| | | Trans-2,3-dibromo-2-buten-1,4-diol | | | | | | | | | | | |
| | | 2,3-dibromo-1,4-butanediol | | | | | | | | | | | |
| | | Triallyl isocyanurate hexabromide | | | | | | | | | | | |
| | | Tetrabromoethan | | | | | | | | | | 1 | |
| | | Tetrabromobutane | | | | | | | | | | | |
| | | 2,2-bis(bromomethyl)-1,3-propanediol | | | | | | | | | | | 1 |
| Additives | Silicon | Dimethyl silicon oil | | | | | | | | | | | |
| | | Methyl phenyl silicon oil | | | | | | | | | | | |
| | | Cyclic silicon oil | | | | | | | | | | | |
| | Phosphoric acid ester | Isodecyl acid phosphate | | | | | | | | | | | |
| | Surfactant | Acrylic polymer | | | | | | | | | | | |
| | | Vinyl ether polymer | | | | | | | | | | | |
| | | Olefin polymer | | | | | | | | | | | |
| | | Butadiene polymer | | | | | | | | | | | |
| Total | | | 100 | 100 | 100 | 100 | 100 | 100 | 100 | 100 | 100 | 100 | 100 |
| Evaluation of Amount of Residue | | | ⊚ | ⊚ | ○ | ○ | ○ | ○ | ⊚ | ⊚ | ⊚ | ⊚ | ⊚ |
| Evaluation of Wet-spreading Property of Solder | | | ○ | ○ | ○ | ○ | ○ | ○ | ○ | ○ | ○ | ○ | ○ |
| Evaluation of Corrosion Resistance | | | ○ | ○ | ○ | ○ | ○ | ○ | ○ | ○ | ○ | ○ | ○ |
| Evaluation of Processabilities (Viscosity) | | | ○ | ○ | ○ | ○ | ○ | ○ | ○ | ○ | ○ | ○ | ○ |
| Total Evaluation | | | ○ | ○ | ○ | ○ | ○ | ○ | ○ | ○ | ○ | ○ | ○ |

TABLE 4

| Material Category | | Material Name | Executed Example 30 | Executed Example 31 | Executed Example 32 | Executed Example 33 | Executed Example 34 | Executed Example 35 | Executed Example 36 | Executed Example 37 | Executed Example 38 |
|---|---|---|---|---|---|---|---|---|---|---|---|
| Rosins | Volatile rosins | Hydrogenated rosins | 35 | 85 | 85 | 85 | 67 | 87 | 87 | 87 | 87 |
| | | Hydrogenated and disproportionated rosins | | | | | | | | | |
| | | Acrylic acid modified and hydrogenated rosins | 10 | | | | | | | | |
| | | Natural rosins | | | | | | | | | |
| | | Disproportionated rosins | | 10 | | | | | | | |
| | | Acrylic acid modified rosins | | | 10 | | | | | | |
| | Non-volatile rosins | Polymerized rosins | | | | 10 | | | | | |
| | | Rosin ester | | | | | | | | | |
| | | Phenol modified rosins | | | | | | | | | |
| Solvents | Solid solvents | Neopentyl glycol | | | | | 28 | | | | |
| Activators | Organic acids | Adipic acid | 2 | | | | | | | | |
| | | Pimelic acid | | 2 | | | | | | | |
| | | Suberic acid | | | | | 2 | | | | |
| | | Dodecanedioic acid | | | 2 | | | 5 | | | |
| | | Glutaric acid | | | | 1 | | | | | |
| | Amine | 2-phenylimidazole | | | | | | 5 | | | |
| | Amine hydrohalide salt | N,N-diethylaniline hydrobromate | | | | | | | 9 | | |
| | Organohalogen compound | 2,2,2-tribromoethanol | | | | | | | | 9 | |
| | | Trans-2,3-dibromo-2-buten-1,4-diol | | | | | | | | | 9 |
| | | 2,3-dibromo-1,4-butanediol | | | | | | | | | |
| | | Triallyl isocyanurate hexabromide | | | | | | | | | |
| | | Tetrabromoethan | | | | | | | | | |
| | | Tetrabromobutane | | | | | | | | | |
| | | 2,2-bis(bromomethyl)-1,3-propanediol | 3 | 3 | 3 | 3 | 3 | 3 | 3 | 3 | 3 |
| Additives | Silicon | Dimethyl silicon oil | | | | | | | 1 | | |
| | | Methyl phenyl silicon oil | | | | | | | | 1 | |
| | | Cyclic silicon oil | | | | | | | | | 1 |
| | Phosphoric acid ester | Isodecyl acid phosphate | | | | | | | | | |
| | Surfactant | Acrylic polymer | | | | | | | | | |
| | | Vinyl ether polymer | | | | | | | | | |
| | | Olefin polymer | | | | | | | | | |
| | | Butadiene polymer | | | | | | | | | |
| | | Total | 100 | 100 | 100 | 100 | 100 | 100 | 100 | 100 | 100 |
| | | Evaluation of Amount of Residue | ◎ | ◎ | ◎ | ◎ | ◎ | ◎ | ◎ | ◎ | ◎ |
| | | Evaluation of Wet-spreading Property of Solder | ○ | ○ | ○ | ○ | ○ | ○ | ○ | ○ | ○ |
| | | Evaluation of Corrosion Resistance | ○ | ○ | ○ | ○ | ○ | ○ | ○ | ○ | ○ |
| | | Evaluation of Processabilities (Viscosity) | ○ | ○ | ○ | ○ | ○ | ○ | ○ | ○ | ○ |
| | | Total Evaluation | ○ | ○ | ○ | ○ | ○ | ○ | ○ | ○ | ○ |

TABLE 5

| Material Category | | Material Name | Executed Example 39 | Executed Example 40 | Executed Example 41 | Executed Example 42 | Executed Example 43 | Executed Example 44 | Executed Example 45 | Executed Example 46 | Executed Example 47 | Executed Example 48 | Executed Example 49 |
|---|---|---|---|---|---|---|---|---|---|---|---|---|---|
| Rosins | Volatile rosins | Hydrogenated rosins | 15 | 14 | 15 | 15 | 15 | 15 | 15 | 15 | 15 | 98 | 98 |
| | | Hydrogenated and disproportionated rosins | 15 | 15 | 15 | 15 | 15 | 15 | 15 | 15 | 15 | | |
| | | Acrylic acid modified and hydrogenated rosins | 15 | 15 | 14 | 14 | 14 | 14 | 14 | 14 | 14 | | |
| | Non-volatile rosins | Natural rosins | 15 | 15 | 10 | 10 | 10 | 10 | 10 | 10 | 10 | | |
| | | Disproportionated rosins | 10 | 10 | 10 | 10 | 10 | 10 | 10 | 10 | 10 | | |
| | | Acrylic acid modified rosins | 10 | 10 | 10 | 10 | 10 | 10 | 10 | 10 | 10 | | |
| | | Polymerized rosins | | | | | | | | | | | |
| | | Rosin ester | | | | | | | | | | | |
| | | Phenol modified rosins | | | | | | | | | | | |
| Solvents | Solid solvents | Neopentyl glycol | | | | | | | | | | | |
| Activators | Organic acids | Adipic acid | 2 | 2 | 1 | 2 | 2 | 2 | 2 | 2 | 1 | | 1.5 |
| | | Pimelic acid | 2 | 2 | 2 | 2 | 2 | 2 | 2 | 2 | 2 | | |
| | | Suberic acid | 2 | 2 | 2 | 2 | 2 | 2 | 2 | 2 | 2 | | |
| | | Dodecanedioic acid | 2 | 2 | 2 | 2 | 2 | 2 | 2 | 2 | 2 | | |
| | | Glutaric acid | 2 | 2 | 2 | 2 | 2 | 2 | 2 | 2 | 2 | | |
| | Amine | 2-phenylimidazole | | 1 | 1 | 1 | 1 | 1 | 1 | 1 | 1 | | |
| | Amine hydrohalide salt | N,N-diethylaniline hydrobromate | 1.5 | 1.5 | 1.5 | 1.5 | 1.5 | 1.5 | 1.5 | 1.5 | 1.5 | | |
| | Organohalogen compound | 2,2,2-tribromoethanol | 1.5 | 1.5 | 1.5 | 1.5 | 1.5 | 1.5 | 1.5 | 1.5 | 1.5 | | |
| | | Trans-2,3-dibromo-2-buten-1,4-diol | 1.5 | 1.5 | 1.5 | 1.5 | 1.5 | 1.5 | 1.5 | 1.5 | 1.5 | | |
| | | 2,3-dibromo-1,4-butanediol | 1.5 | 1.5 | 1.5 | 1.5 | 1.5 | 1.5 | 1.5 | 1.5 | 1.5 | | |
| | | Triallyl isocyanurate hexabromide | 1.5 | 1.5 | 1.5 | 1.5 | 1.5 | 1.5 | 1.5 | 1.5 | 1.5 | | |
| | | Tetrabromoethan | 1.5 | 1.5 | 1.5 | 1.5 | 1.5 | 1.5 | 1.5 | 1.5 | 1.5 | | |
| | | Tetrabromobutane | 1 | 1 | 1 | 1 | 1 | 1 | 1 | 1 | 1 | 2 | 0.5 |
| | | 2,2-bis(bromomethyl)-1,3-propanediol | | | | | | | | | | | |
| Additives | Silicon | Dimethyl silicon oil | | | 1 | 1 | 1 | 1 | 1 | 1 | 0.4 | | |
| | | Methyl phenyl silicon oil | | | | | | | | 1 | 0.3 | | |
| | | Cyclic silicon oil | | | | | | | | | 0.3 | | |
| | Phosphoric acid ester | Isodecyl acid phosphate | | | 1 | 1 | 1 | 1 | 1 | 1 | 1 | | |
| | Surfactant | Acrylic polymer | | | | | | | 1 | | 0.3 | | |
| | | Vinyl ether polymer | | | | | | | | 1 | 0.3 | | |
| | | Olefin polymer | | | | | | | | | 0.2 | | |
| | | Butadiene polymer | | | | | | | | 1 | 0.2 | | |
| | Total | | 100 | 100 | 100 | 100 | 100 | 100 | 100 | 100 | 100 | 100 | 100 |
| | Evaluation of Amount of Residue | | ⊚ | ⊚ | ⊚ | ⊚ | ⊚ | ⊚ | ⊚ | ⊚ | ⊚ | ⊚ | ⊚ |
| | Evaluation of Wet-spreading Property of Solder | | ○ | ○ | ○ | ○ | ○ | ○ | ○ | ○ | ○ | ○ | ○ |
| | Evaluation of Corrosion Resistance | | ○ | ○ | ○ | ○ | ○ | ○ | ○ | ○ | ○ | ○ | ○ |
| | Evaluation of Processabilities (Viscosity) | | ○ | ○ | ○ | ○ | ○ | ○ | ○ | ○ | ○ | ○ | ○ |
| | Total Evaluation | | ○ | ○ | ○ | ○ | ○ | ○ | ○ | ○ | ○ | ○ | ○ |

TABLE 6

| Material Category | | Material Name | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|---|---|
| Rosins | Volatile rosins | Hydrogenated rosins | 97 | | | | | | | | |
| | | Hydrogenated and disproportionated rosins | | 91 | | | | | | | |
| | | Acrylic acid modified and hydrogenated rosins | | | | | | | | | |
| | | Natural rosins | | | | | | | | | |
| | | Disproportionated rosins | | | | | | | | | |
| | | Acrylic acid modified rosins | | | | | | | | | |
| | Non-volatile rosins | Polymerized rosins | | | 87 | | | | 42 | | |
| | | Rosin ester | | | | 87 | | | 45 | 98 | 42 |
| | | Phenol modified rosins | | | | | 87 | | | | |
| Solvents | Solid solvents | Neopentyl glycol | | | | | | | | 2 | 50 |
| Activators | Organic acids | Adipic acid | | | | | | 12 | | | |
| | | Pimelic acid | | | | | | 15 | | | |
| | | Suberic acid | | | | | | 15 | | | |
| | | Dodecanedioic acid | | | | | | 15 | | | |
| | | Glutaric acid | 3 | 3 | 10 | 10 | 10 | 15 | 10 | | 5 |
| | Amine | 2-phenylimidazole | | 3 | | | | 15 | | | |
| | Amine hydrohalide salt | N, N-diethylaniline hydrobromate | | 3 | | | | 10 | | | |
| | Organohalogen compound | 2,2,2-tribromoethanol | | | 3 | 3 | 3 | 3 | 3 | | 3 |
| | | Trans-2,3-dibromo-2-buten-1,4-diol | | | | | | | | | |
| | | 2,3-dibromo-1,4-butanediol | | | | | | | | | |
| | | Triallyl isocyanurate hexabromide | | | | | | | | | |
| | | Tetrabromoethan | | | | | | | | | |
| | | Tetrabromobutane | | | | | | | | | |
| | | 2,2-bis(bromomethyl)-1,3-propanediol | | | | | | | | | |
| Additives | Silicon | Dimethyl silicon oil | | | | | | | | | |
| | | Methyl phenyl silicon oil | | | | | | | | | |
| | | Cyclic silicon oil | | | | | | | | | |
| | Phosphoric acid ester | Isodecyl acid phosphate | | | | | | | | | |
| | Surfactant | Acrylic polymer | | | | | | | | | |
| | | Vinyl ether polymer | | | | | | | | | |
| | | Olefin polymer | | | | | | | | | |
| | | Butadiene polymer | | | | | | | | | |
| | | Total | 100 | 100 | 100 | 100 | 100 | 100 | 100 | 100 | 100 |
| | | Evaluation of Amount of Residue | ◎ | ◎ | X | X | X | X | X | X | X |
| | | Evaluation of Wet-spreading Property of Solder | X | ○ | ○ | ○ | ○ | ○ | ○ | X | — |
| | | Evaluation of Corrosion Resistance | ○ | X | ○ | ○ | ○ | ○ | ○ | ○ | ○ |
| | | Evaluation of Processabilities (Viscosity) | ○ | ○ | ○ | ○ | ○ | ○ | ○ | ○ | X |
| | | Total Evaluation | X | X | X | X | X | X | X | X | X |

In the flux of the Executed Example 1 which contained hydrogenated rosin as the volatile rosin in an amount of 94 wt % in a range limited by the present invention, dodecanedioic acid as the organic acid in an amount of 3 wt % in a range limited by the present invention, and 2,2,2-tribromoethanol as the organohalogen compound in an amount of 3 wt % in a range limited by the present invention, the weight of flux after heating, namely an amount of residue of the flux showed 15% or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 2 which contained hydrogenated rosin as the volatile rosin in an amount of 91.5 wt % in a range limited by the present invention, dodecanedioic acid as the organic acid in an amount of 3 wt % in a range limited by the present invention, N, N-diethylaniline hydrobromate as the amine hydrohalide salt in an amount of 2.5 wt % in a range limited by the present invention and 2,2,2-tribromoethanol as the organohalogen compound in an amount of 3 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 3 which contained hydrogenated rosin as the volatile rosin in an amount of 92 wt % in a range limited by the present invention, dodecanedioic acid as the organic acid in an amount of 3 wt % in a range limited by the present invention, N, N-diethylaniline hydrobromate as the amine hydrohalide salt in an amount of 2 wt % in a range limited by the present invention and 2,2,2-tribromoethanol as the organohalogen compound in an amount of 3 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 4 which contained hydrogenated rosin as the volatile rosin in an amount of 92.5 wt % in a range limited by the present invention, dodecanedioic acid as the organic acid in an amount of 3 wt % in a range limited by the present invention, N, N-diethylaniline hydrobromate as the amine hydrohalide salt in an amount of 1.5 wt % in a range limited by the present invention and 2,2,2-tribromoethanol as the organohalogen compound in an amount of 3 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 5 which contained hydrogenated rosin as the volatile rosin in an amount of 93 wt % in a range limited by the present invention, dodecanedioic acid as the organic acid in an amount of 3 wt % in a range limited by the present invention, N, N-diethylaniline hydrobromate as the amine hydrohalide salt in an amount of 1 wt % in a range limited by the present invention and 2,2,2-tribromoethanol as the organohalogen compound in an amount of 3 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 6 which contained hydrogenated rosin as the volatile rosin in an amount of 93.5 wt % in a range limited by the present invention, dodecanedioic acid as the organic acid in an amount of 3 wt % in a range limited by the present invention, N, N-diethylaniline hydrobromate as the amine hydrohalide salt in an amount of 0.5 wt % in a range limited by the present invention and 2,2,2-tribromoethanol as the organohalogen compound in an amount of 3 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 7 which contained hydrogenated rosin as the volatile rosin in an amount of 96 wt % in a range limited by the present invention, dodecanedioic acid as the organic acid in an amount of 3 wt % in a range limited by the present invention, and 2,2,2-tribromoethanol as the organohalogen compound in an amount of 1 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 8 which contained hydrogenated rosin as the volatile rosin in an amount of 92 wt % in a range limited by the present invention, dodecanedioic acid as the organic acid in an amount of 3 wt % in a range limited by the present invention, and 2,2,2-tribromoethanol as the organohalogen compound in an amount of 5 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 9 which contained hydrogenated rosin as the volatile rosin in an amount of 90 wt % in a range limited by the present invention, dodecanedioic acid as the organic acid in an amount of 3 wt % in a range limited by the present invention, and 2,2,2-tribromoethanol as the organohalogen compound in an amount of 7 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 10 which contained hydrogenated rosin as the volatile rosin in an amount of 87 wt % in a range limited by the present invention, dodecanedioic acid as the organic acid in an amount of 3 wt % in a range limited by the present invention, and 2,2,2-tribromoethanol as the organohalogen compound in an amount of 10 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 11 which contained hydrogenated rosin as the volatile rosin in an amount of 92 wt % in a range limited by the present invention, dodecanedioic acid as the organic acid in an amount of 3 wt % in a range limited by the present invention, and trans-2,3-dibromo-2-buten-1,4-diol as the organohalogen compound in an amount of 5 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 12 which contained hydrogenated rosin as the volatile rosin in an amount of 92 wt % in a range limited by the present invention, dodecanedioic acid as the organic acid in an amount of 3 wt % in a range limited by the present invention, and 2,3-dibromo-1,4-butanediol as the organohalogen compound in an amount of 5 wt % in a range limited by the present invention, the weight of flux after heating, namely an amount of residue of the flux was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 13 which contained hydrogenated rosin as the volatile rosin in an amount of 92 wt % in a range limited by the present invention, dodecanedioic acid as the organic acid in an amount of 3 wt % in a range limited by the present invention, and triallyl isocyanurate hexabromide as the organohalogen compound in an amount of 5 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 14 which contained hydrogenated rosin as the volatile rosin in an amount of 92 wt % in a range limited by the present invention, dodecanedioic acid as the organic acid in an amount of 3 wt % in a range limited by the present invention, and tetrabromoethane as the organohalogen compound in an amount of 5 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 15 which contained hydrogenated rosin as the volatile rosin in an amount of 92 wt % in a range limited by the present invention, dodecanedioic acid as the organic acid in an amount of 3 wt % in a range limited by the present invention, and tetrabromobutane as the organohalogen compound in an amount of 5 wt % in a range limited by the present invention, the weight of flux after heating, namely an amount of residue was 15 wt % or less of that before the heating, which enabled to be obtained any sufficient effect such that the amount of the residue of the flux was restrained to be made low residue.

The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 16 which contained hydrogenated rosin as the volatile rosin in an amount of 92 wt % in a range limited by the present invention, dodecanedioic acid as the organic acid in an amount of 3 wt % in a range limited by the present invention, and 2,2-bis(bromomethyl)-1,3-propanediol as the organohalogen compound in an amount of 5 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 17 which contained hydrogenated rosin as the volatile rosin in an amount of 87 wt % in a range limited by the present invention, dodecanedioic acid as the organic acid in an amount of 3 wt % in a range limited by the present invention, and, as the organohalogen compound, 2,2,2-tribromoethanol in an amount of 1.5 wt % in a range limited by the present invention, trans-2,3-dibromo-2-buten-1,4-diol in an amount of 1.5 wt % in a range limited by the present invention, 2,3-dibromo-1,4-butanediol in an amount of 1.5 wt % in a range limited by the present invention, triallyl isocyanurate hexabromide in an amount of 1.5 wt % in a range limited by the present invention, tetrabromoethane in an amount of 1.5 wt % in a range limited by the present invention, tetrabromobutane in an amount of 1.5 wt % in a range limited by the present invention, and 2,2-bis(bromomethyl)-1,3-propanediol in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 18 which contained hydrogenated rosin as the volatile rosin in an amount of 86 wt % in a range limited by the present invention, dodecanedioic acid as the organic acid in an amount of 3 wt % in a range limited by the present invention, N, N-diethylaniline hydrobromate as the amine hydrohalide salt in an amount of 1 wt % in a range limited by the present invention, and, as the organohalogen compound, 2,2,2-tribromoethanol in an amount of 1.5 wt % in a range limited by the present invention, trans-2,3-dibromo-2-buten-1,4-diol in an amount of 1.5 wt % in a range limited by the present invention, 2,3-dibromo-1,4-butanediol in an amount of 1.5 wt % in a range limited by the present invention, triallyl isocyanurate hexabromide in an amount of 1.5 wt % in a range limited by the present invention, tetrabromoethane in an amount of 1.5 wt % in a range limited by the present invention, tetrabromobutane in an amount of 1.5 wt % in a range limited by the present invention, and 2,2-bis(bromomethyl)-1,3-propanediol in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 19 which contained hydrogenated and disproportionated rosin as the volatile rosin in an amount of 87 wt % in a range limited by the present invention, adipic acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 20 which contained acrylic acid modified and hydrogenated rosin as the volatile rosin in an amount of 87 wt % in a range limited by the present invention, pimelic acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 21 which contained natural rosin as the volatile rosin in an amount of 87 wt % in a range limited by the present invention, dodecanedioic acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was more than 15 wt % but 20 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 22 which contained natural rosin as the volatile rosin in an amount of 87 wt % in a range limited by the present invention, glutaric acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was more than 15 wt % but 20 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 23 which contained disproportionated rosin as the volatile rosin in an amount of 87 wt % in a range limited by the present invention, dodecanedioic acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 24 which contained acrylic acid modified rosin as the volatile rosin in an amount of 87 wt % in a range limited by the present invention, dodecanedioic acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 25 which contained, as the volatile rosin, hydrogenated rosin in an amount of 27 wt %, hydrogenated and disproportionated rosin in an amount of 30 wt %, and acrylic acid modified and hydrogenated rosin in an amount of 30 wt %, a total amount of these volatile rosins being within a range limited by the present invention, suberic acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 26 which contained, as the volatile rosin, hydrogenated rosin in an amount of 12 wt %, hydrogenated and disproportionated rosin in an amount of 15 wt %, acrylic acid modified and hydrogenated rosin in an amount of 15 wt %, natural rosin in an amount of 15 wt % and disproportionated rosin in an amount of 15 wt %, a total amount of these volatile rosins being within a range limited by the present invention, dodecanedioic acid as the organic acid in an amount of 10 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux o the Executed Example 27 which contained, as the volatile rosin, hydrogenated rosin in an amount of 70 wt % in a range limited by the present invention and natural rosin in an amount of 10 wt % in a range limited by the present invention, pimelic acid as the organic acid in an amount of 10 wt % in a range limited by the present invention, and 2,2,2-tribromoethanol as the organohalogen compound in an amount of 10 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 28 which contained hydrogenated rosin as the volatile rosin in an amount of 98 wt % in a range limited by the present invention, pimelic acid as the organic acid in an amount of 1 wt % in a range limited by the present invention, and trans-2,3-dibromo-2-buten-1,4-diol as the organohalogen compound in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 29 which contained hydrogenated rosin as the volatile rosin in an amount of 98 wt % in a range limited by the present invention, pimelic acid as the organic acid in an amount of 1 wt % in a range limited by the present invention, and triallyl isocyanurate hexabromide as the organohalogen compound in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 30 which contained, as the volatile rosin, hydrogenated rosin in an amount of 85 wt % in a range limited by the present invention and disproportionated rosin in an amount of 10 wt % in a range limited by the present invention, pimelic acid as the organic acid in an amount of 2 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 31 which contained, as the volatile rosin, hydrogenated rosin in an amount of 85 wt % in a range limited by the present invention and acrylic acid modified rosin in an amount of 10 wt % in a range limited by the present invention, suberic acid as the organic acid in an amount of 2 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 32 which contained hydrogenated rosin as the volatile rosin in an amount of 85 wt % in a range limited by the present invention, polymerized rosin as the non-volatile rosin in an amount of 10 wt % in a range limited by the present invention, dodecanedioic acid as the organic acid in an amount of 2 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 33 which contained hydrogenated rosin as the volatile rosin in an amount of 85 wt % in a range limited by the present invention, rosin ester as the non-volatile rosin in an amount of 10 wt % in a range limited by the present invention, pimelic acid as the organic acid in an amount of 1 wt % in a range limited by the present invention, dodecanedioic acid as the organic acid in an amount of 1 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 34 which contained hydrogenated rosin as the volatile rosin in an amount of 67 wt % in a range limited by the present invention, neopentyl glycol as the solid solvent in an amount of 28 wt % in a range limited by the present invention, pimelic acid as the organic acid in an amount of 2 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 35 which contained hydrogenated rosin as the volatile rosin in an amount of 87 wt % in a range limited by the present invention, suberic acid as the organic acid in an amount of 5 wt % in a range limited by the present invention, 2-phenylimidazole as the amine in an amount of 5 wt % in a range limited by the present invention, and 2,2,2-tribromoethanol as the organohalogen compound in an amount of 3 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 36 which contained hydrogenated rosin as the volatile rosin in an amount of 87 wt % in a range limited by the present invention, dodecanedioic acid as the organic acid in an amount of 9 wt % in a range limited by the present invention, 2,2,2-tribromoethanol as the organohalogen compound in an amount of 3 wt % in a range limited by the present invention, and dimethyl silicon oil as the silicon in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 37 which contained hydrogenated rosin as the volatile rosin in an amount of 87 wt % in a range limited by the present invention, dodecanedioic acid as the organic acid in an amount of 9 wt % in a range limited by the present invention, 2,2,2-tribromoethanol as the organohalogen compound in an amount of 3 wt % in a range limited by the present invention, and isodecyl acid phosphate as the phosphoric acid ester in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 38 which contained hydrogenated rosin as the volatile rosin in an amount of 87 wt % in a range limited by the present invention, dodecanedioic acid as the organic acid in an amount of 9 wt % in a range limited by the present invention, 2,2,2-tribromoethanol as the organohalogen compound in an amount of 3 wt % in a range limited by the present invention, and acrylic polymer as the surfactant in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 39 which contained, as the volatile rosin, hydrogenated rosin in an amount of 15 wt %, hydrogenated and disproportionated rosin in an amount of 15 wt %, acrylic acid modified and hydrogenated rosin in an amount of 15 wt %, natural rosin in an amount of 15 wt %, disproportionated rosin in an amount of 10 wt %, and acrylic acid modified rosin in an amount of 10 wt %, a total amount of these volatile rosins being within a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, and 2,2-bis(bromomethyl)-1,3-propanediol as the organohalogen compound in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 40 which contained, as the volatile rosin, hydrogenated rosin in an amount of 14 wt %, hydrogenated and disproportionated rosin in an amount of 15 wt %, acrylic acid modified and hydrogenated rosin in an amount of 15 wt %, natural rosin in an amount of 15 wt %, disproportionated rosin in an amount of 10 wt %, and acrylic acid modified rosin in an amount of 10 wt %, a total amount of these volatile rosins being within a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, and 2,2-bis(bromomethyl)-1,3-propanediol as the organohalogen compound in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 41 which contained, as the volatile rosin, hydrogenated rosin in an amount of 15 wt %, hydrogenated and disproportionated rosin in an amount of 15 wt %, acrylic acid modified and hydrogenated rosin in an amount of 14 wt %, natural rosin in an amount of 10 wt %, disproportionated rosin in an amount of 10 wt %, and acrylic acid modified rosin in an amount of 10 wt %, a total amount of these volatile rosins being within a range limited by the present invention, neopentyl glycol as the solid solvent in an amount of 1 wt % in a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2-phenylimidazole as the amine in an amount of 1 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, 2,2-bis(bromomethyl)-1,3-propanediol as the organohalogen compound in an amount of 1 wt % in a range limited by the present invention, dimethyl silicon oil as the silicon in an amount of 1 wt % in a range limited by the present invention, isodecyl acid phosphate as the phosphoric acid ester in an amount of 1 wt % in a range limited by the present invention, and acrylic polymer as the surfactant in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 42 which contained, as the volatile rosin, hydrogenated rosin in an amount of 15 wt %, hydrogenated and disproportionated rosin in an amount of 15 wt %, acrylic acid modified and hydrogenated rosin in an amount of 14 wt %, natural rosin in an amount of 10 wt %, disproportionated rosin in an amount of 10 wt %, and acrylic acid modified rosin in an amount of 10 wt %, a total amount of these volatile rosins being within a range limited by the present invention, neopentyl glycol as the solid solvent in an amount of 1 wt % in a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2-phenylimidazole as the amine in an amount of 1 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, 2,2-bis(bromomethyl)-1,3-propanediol as the organohalogen compound in an amount of 1 wt % in a range limited by the present invention, methyl phenyl silicon oil as the silicon in an amount of 1 wt % in a range limited by the present invention, isodecyl acid phosphate as the phosphoric acid ester in an amount of 1 wt % in a range limited by the present invention, and acrylic polymer as the surfactant in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 43 which contained, as the volatile rosin, hydrogenated rosin in an amount of 15 wt %, hydrogenated and disproportionated rosin in an amount of 15 wt %, acrylic acid modified and hydrogenated rosin in an amount of 14 wt %, natural rosin in an amount of 10 wt %, disproportionated rosin in an amount of 10 wt %, and acrylic acid modified rosin in an amount of 10 wt %, a total amount of these volatile rosins being within a range limited by the present invention, neopentyl glycol as the solid solvent in an amount of 1 wt % in a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2-phenylimidazole as the amine in an amount of 1 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, 2,2-bis(bromomethyl)-1,3-propanediol as the organohalogen compound in an amount of 1 wt % in a range limited by the present invention, cyclic silicon oil as the silicon in an amount of 1 wt % in a range limited by the present invention, isodecyl acid phosphate as the phosphoric acid ester in an amount of 1 wt % in a range limited by the present invention, and acrylic polymer as the surfactant in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 44 which contained, as the volatile rosin, hydrogenated rosin in an amount of 15 wt %, hydrogenated and disproportionated rosin in an amount of 15 wt %, acrylic acid modified and hydrogenated rosin in an amount of 14 wt %, natural rosin in an amount of 10 wt %, disproportionated rosin in an amount of 10 wt %, and acrylic acid modified rosin in an amount of 10 wt %, a total amount of these volatile rosins being within a range limited by the present invention, neopentyl glycol as the solid solvent in an amount of 1 wt % in a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2-phenylimidazole as the amine in an amount of 1 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, 2,2-bis(bromomethyl)-1,3-propanediol as the organohalogen compound in an amount of 1 wt % in a range limited by the present invention, dimethyl silicon oil as the silicon in an amount of 1 wt % in a range limited by the present invention, isodecyl acid phosphate as the phosphoric acid ester in an amount of 1 wt % in a range limited by the present invention, and vinyl ether polymer as the surfactant in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 45 which contained, as the volatile rosin, hydrogenated rosin in an amount of 15 wt %, hydrogenated and disproportionated rosin in an amount of 15 wt %, acrylic acid modified and hydrogenated rosin in an amount of 14 wt %, natural rosin in an amount of 10 wt %, disproportionated rosin in an amount of 10 wt %, and acrylic acid modified rosin in an amount of 10 wt %, a total amount of these volatile rosins being within a range limited by the present invention, neopentyl glycol as the solid solvent in an amount of 1 wt % in a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2-phenylimidazole as the amine in an amount of 1 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, 2,2-bis(bromomethyl)-1,3-propanediol as the organohalogen compound in an amount of 1 wt % in a range limited by the present invention, dimethyl silicon oil as the silicon in an amount of 1 wt % in a range limited by the present invention, isodecyl acid phosphate as the phosphoric acid ester in an amount of 1 wt % in a range limited by the present invention, and olefin polymer as the surfactant in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 46 which contained, as the volatile rosin, hydrogenated rosin in an amount of 15 wt %, hydrogenated and disproportionated rosin in an amount of 15 wt %, acrylic acid modified and hydrogenated rosin in an amount of 14 wt %, natural rosin in an amount of 10 wt %, disproportionated rosin in an amount of 10 wt %, and acrylic acid modified rosin in an amount of 10 wt %, a total amount of these volatile rosins being within a range limited by the present invention, neopentyl glycol as the solid solvent in an amount of 1 wt % in a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2-phenylimidazole as the amine in an amount of 1 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, 2,2-bis(bromomethyl)-1,3-propanediol as the organohalogen compound in an amount of 1 wt % in a range limited by the present invention, dimethyl silicon oil as the silicon in an amount of 1 wt % in a range limited by the present invention, isodecyl acid phosphate as the phosphoric acid ester in an amount of 1 wt % in a range limited by the present invention, and butadiene polymer as the surfactant in an amount of 1 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 47 which contained, as the volatile rosin, hydrogenated rosin in an amount of 15 wt %, hydrogenated and disproportionated rosin in an amount of 15 wt %, acrylic acid modified and hydrogenated rosin in an amount of 14 wt %, natural rosin in an amount of 10 wt %, disproportionated rosin in an amount of 10 wt %, and acrylic acid modified rosin in an amount of 10 wt %, a total amount of these volatile rosins being within a range limited by the present invention, neopentyl glycol as the solid solvent in an amount of 1 wt % in a range limited by the present invention, adipic acid as the organic acid in an amount of 2 wt % in a range limited by the present invention, pimelic acid as the organic acid in an amount of 2 wt % in a range limited by the present invention, suberic acid as the organic acid in an amount of 2 wt % in a range limited by the present invention, dodecanedioic acid as the organic acid in an amount of 2 wt % in a range limited by the present invention, glutaric acid as the organic acid in an amount of 2 wt % in a range limited by the present invention, 2-phenylimidazole as the amine in an amount of 1 wt % in a range limited by the present invention, N, N-diethylaniline hydrobromate as the amine hydrohalide salt in an amount of 1 wt % in a range limited by the present invention, 2,2,2-tribromoethanol as the organohalogen compound in an amount of 1.5 wt % in a range limited by the present invention, trans-2,3-dibromo-2-buten-1,4-diol as the organohalogen compound in an amount of 1.5 wt % in a range limited by the present invention, 2,3-dibromo-1,4-butanediol as the organohalogen compound in an amount of 1.5 wt % in a range limited by the present invention, triallyl isocyanurate hexabromide as the organohalogen compound in an amount of 1.5 wt % in a range limited by the present invention, tetrabromoethane as the organohalogen compound in an amount of 1.5 wt % in a range limited by the present invention, tetrabromobutane as the organohalogen compound in an amount of 1.5 wt % in a range limited by the present invention, 2,2-bis(bromomethyl)-1,3-propanediol as the organohalogen compound in an amount of 1 wt % in a range limited by the present invention, dimethyl silicon oil as the silicon in an amount of 0.4 wt % in a range limited by the present invention, methyl phenyl silicon oil as the silicon in an amount of 0.3 wt % in a range limited by the present invention, cyclic silicon oil as the silicon in an amount of 0.3 wt % in a range limited by the present invention, isodecyl acid phosphate as the phosphoric acid ester in an amount of 1 wt % in a range limited by the present invention, acrylic polymer as the surfactant in an amount of 0.3 wt % in a range limited by the present invention, vinyl ether polymer as the surfactant in an amount of 0.3 wt % in a range limited by the present invention, olefin polymer as the surfactant in an amount of 0.2 wt % in a range limited by the present invention, and butadiene polymer as the surfactant in an amount of 0.2 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 48 which contained hydrogenated rosin as the volatile rosin in an amount of 98 wt % in a range limited by the present invention, and trans-2,3-dibromo-2-buten-1,4-diol as the organohalogen compound in an amount of 2 wt % in a range limited by the present invention, excluding any organic acid, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

In the flux of the Executed Example 49 which contained hydrogenated rosin as the volatile rosin in an amount of 98 wt % in a range limited by the present invention, pimelic acid as the organic acid in an amount of 1.5 wt % in a range limited by the present invention, and 2,2,2-tribromoethanol as the organohalogen compound in an amount of 0.5 wt % in a range limited by the present invention, the weight of flux after heating, namely an amount of residue was 15 wt % or less of that before the heating, which enabled to be obtained any sufficient effect such that the amount of the residue of the flux was restrained to be made low residue. The resin flux cored solder showed wet-spreading rate of 70% or more, which enabled to be obtained any sufficient effect to the wet-spreading property of the solder. The state of the flux was a solid at 25 degrees C. or its state was a liquid at 25 degrees C. but the viscosity thereof was 3500 Pa·s or more, thereby enabling to be obtained sufficient effects to the processabilities when manufacturing the resin flux cored solder. In addition, the copper mirror specimen showed transmittance of 50% or less in the corrosion test using the copper mirror, which restrained any corrosion and enabled to be obtained any sufficient effect to the corrosion.

On the other hand, in the flux of the Comparative Example 1 which contained hydrogenated rosin as the volatile rosin in an amount of 97 wt % in a range limited by the present invention and dodecanedioic acid as the organic acid in an amount of 3 wt % in a range limited by the present invention but excludes any organohalogen compound, the weight of flux after heating, namely an amount of residue was 15 wt % or less of that before the heating but the resin flux cored solder showed wet-spreading rate of less than 70%, which did not enable to be obtained any sufficient effect to the wet-spreading property of the solder.

In the flux of the Comparative Example 2 which contained hydrogenated rosin as the volatile rosin in an amount of 91 wt % in a range limited by the present invention, dodecanedioic acid as the organic acid in an amount of 3 wt % in a range limited by the present invention, 2,2,2-tribromoethanol as the organohalogen compound in an amount of 3 wt % in a range limited by the present invention, and N,N-diethylaniline hydrobromate as the amine hydrohalide salt in an amount of 3 wt % exceeding a range limited by the present invention, the weight of flux after heating, namely an amount of residue was 15 wt % or less of that before the heating but the copper mirror specimen showed transmittance exceeding 50% in the corrosion test using the copper mirror, which did not enable to be obtained any sufficient effect to the corrosion.

In the flux of the Comparative Example 3 which did not contain any volatile rosin but contained polymerized rosin as the non-volatile rosin in an amount of 87 wt % exceeding a range limited by the present invention, the flux of the Comparative Example 4 which did not contain any volatile rosin but contained rosin ester as the non-volatile rosin in an amount of 87 wt % exceeding a range limited by the present invention, and the flux of the Comparative Example 5 which did not contain any volatile rosin but contained phenol modified rosin as the non-volatile rosin in an amount of 87 wt % exceeding a range limited by the present invention, the weight of each flux after heating, namely an amount of residue exceeded 20 wt % of that before the heating, even if the flux contains dodecanedioic acid as the organic acid in an amount of 3 wt % in a range limited by the present invention, and 2,2,2-tribromoethanol as the organohalogen compound in an amount of 3 wt % in a range limited by the present invention. This could not obtain any sufficient effect such that the amount of the residue was restrained to be made low residue.

In the flux of the Comparative Example 6 which contained, as the volatile rosin, natural rosin in an amount of 12 wt %, disproportionated rosin in an amount of 15 wt %, and acrylic acid modified rosin in an amount of 15 wt %, a total amount of these volatile rosins being within a range limited by the present invention, but contains polymerized rosin as the non-volatile rosin in an amount of 15 wt % exceeding a range limited by the present invention, rosin ester as the non-volatile rosin in an amount of 15 wt % exceeding a range limited by the present invention, and phenol modified rosin as the non-volatile rosin in an amount of 15 wt % exceeding a range limited by the present invention, a total amount of these non-volatile rosins exceeding a range limited by the present invention, the weight of the flux after heating, namely an amount of residue exceeded 20 wt % of that before the heating, even if the flux contains dodecanedioic acid as the organic acid in an amount of 3 wt % in the range limited by the present invention, and 2,2,2-tribromoethanol as the organohalogen compound in an amount of 3 wt % in the range limited by the present invention. This could not obtain any sufficient effect such that the amount of the residue was restrained to be made low residue.

In the flux of the Comparative Example 7 which contained hydrogenated rosin as the volatile rosin in an amount of 42 wt % below a range limited by the present invention and rosin ester as the non-volatile rosin in an amount of 45 wt % exceeding a range limited by the present invention, the weight of the flux after heating, namely an amount of residue exceeded 20 wt % of that before the heating, even if the flux contains dodecanedioic acid as the organic acid in an amount of 3 wt % in the range limited by the present invention, and 2,2,2-tribromoethanol as the organohalogen compound in an amount of 3 wt % in the range limited by the present invention. This could not obtain any sufficient effect such that the amount of the residue was restrained to be made low residue.

In the flux of the Comparative Example 8 which did not contain any volatile rosin but contained rosin ester as the non-volatile rosin in an amount of 98 wt % exceeding a range limited by the present invention, and adipic acid as the organic acid in an amount of 2 wt % in a range limited by the present invention, the weight of the flux after heating, namely an amount of residue exceeded 20 wt % of that before the heating, which could not obtain any sufficient effect such that the amount of the residue was restrained to be made low residue. In addition, the resin flux cored solder showed wet-spreading rate of less than 70%, which did not enable to be obtained any sufficient effect to the wet-spreading property of the solder.

In the flux of the Comparative Example 9 which did not contain any volatile rosin but contained rosin ester as the non-volatile rosin in an amount of 42 wt % exceeding a range limited by the present invention, and neopentyl glycol as the solid solvent in an amount of 50 wt % exceeding a range limited by the present invention, the weight of the flux after heating, namely an amount of residue exceeded 20 wt % of that before the heating, even if the flux contains adipic acid as the organic acid in an amount of 5 wt % in a range limited by the present invention and 2,2,2-tribromoethanol as the organohalogen compound in an amount of 3 wt % in the range limited by the present invention. This could not obtain any sufficient effect such that the amount of the residue was restrained to be made low residue. In addition, its state was a liquid at a temperature of 25 degrees C. and had viscosity of less than 3500 Pa·s, so that sufficient effects to the processabilities when manufacturing the resin flux cored solder were not obtained. In the Comparative Example 9, the evaluation of wet-spreading property of solder was not carried out because the sufficient effects to the processabilities when manufacturing the resin flux cored solder were not obtained and the resin flux cored solder could not be manufactured.

From the above, flux containing volatile rosin in an amount of 70 wt % or more and 98 wt % or less, non-volatile rosin in an amount of 0 wt % or more and 10% or less, and an activator in an amount of 2 wt % or more and 30 wt % or less, wherein the activator contains an organic acid in an amount of 0 wt % or more and 15 wt % or less, an organohalogen compound in an amount of 0.5 wt % or more and 15 wt % or less, an amine in an amount of 0 wt % or more and 5 wt % or less, and an amine hydrohalide salt in an amount of 0 wt % or more and 2.5 wt % or less, and a resin flux cored solder using the flux obtain any sufficient effect such that the amount of the residue was restrained to be made low residue and any sufficient effect to the wet-spreading property of the solder. They also obtain any sufficient effects to the processabilities and any sufficient effect to prevent the corrosion.

These effects are not inhibited even when containing any non-volatile rosins, solid solvents and/or additives in a range limited by the present invention.

It is to be noted that any technical scope of the claims and/or meaning of term(s) claimed in the claims are not limited to the description in the above-mentioned embodiments. It should be understood by those skilled in the art that various modifications, combinations, sub-combinations and alternations may occur depending on design requirements and other factors insofar as they are within the scope of the appended claims or the equivalents thereof.

What is claimed is:

1. A flux for resin flux cored solder, the flux comprising:
   volatile rosin in an amount of 70 wt % or more and 98 wt % or less;
   non-volatile rosin in an amount of 0 wt % or more and 10 wt % or less; and
   an activator in an amount of 2 wt % or more and 30 wt % or less,
   the activator including:
      an organic acid in an amount of 0 wt % or more and 15 wt % or less;
      an organohalogen compound in an amount of 0.5 wt % or more and 15 wt % or less;
      an amine in an amount of 0 wt % or more and 5 wt % or less; and
      an amine hydrohalide salt in an amount of 0 wt % or more and 2.5 wt % or less,
   wherein the organic acid is at least one compound selected from the group consisting of: glutaric acid, adipic acid, pimelic acid, azelaic acid, eicosane diacid, citric acid, glycolic acid, succinic acid, salicylic acid, diglycolic acid, dipicolinic acid, dibutyl aniline diglycolic acid, suberic acid, sebacic acid, thioglycol acid, phthalic acid, isophthalic acid, terephthalic acid, dodecanedioic acid, parahydroxyphenylacetic acid, picolinic acid, phenylsuccinic acid, fumaric acid, maleic acid, malonic acid, lauric acid, benzoic acid, tartaric acid, tris(2-carboxyethyl)isocyanurate, glycine, 1,3-cyclohexanedicarboxylic acid, 2,2-bis(hydroxymethyl)propionic acid, 2,2-bis(hydroxymethyl)butanoic acid, 4-tert-butyl benzoic acid, 2,3-dihydroxybenzoic acid, 2,4-diethyl glutaric acid, 2-quinolinecarboxylic acid, 3-hydroxybenzoic acid, malic acid, p-anisic acid, palmitic acid, stearic acid, 12-hydroxystearic acid, oleic acid, linoleic acid, linolenic acid, a first dimer acid which is a reactant of oleic acid and linoleic acid, a first trimer acid which is a reactant of oleic acid and linoleic acid, a first hydrogenated dimer acid that is obtained by adding hydrogen to the first dimer acid, a first hydrogenated trimer acid that is obtained by adding hydrogen to the first trimer acid, a second dimer acid which is a reactant of acrylic acid, a second trimer acid which is a reactant of acrylic acid, a second hydrogenated dimer acid that is obtained by adding hydrogen to the second dimer acid, a second hydrogenated trimer acid that is obtained by adding hydrogen to the second trimer acid, a third dimer acid which is a reactant of methacrylic acid, a third trimer acid which is a reactant of methacrylic acid, a third hydrogenated dimer acid that is obtained by adding hydrogen to the third dimer acid, a third hydrogenated trimer acid that is obtained by adding hydrogen to the third trimer acid, a fourth dimer acid which is a reactant of acrylic acid and methacrylic acid, a fourth trimer acid which is a reactant of acrylic acid and methacrylic acid, a fourth hydrogenated dimer acid that is obtained by adding hydrogen to the fourth dimer acid, a fourth hydrogenated trimer acid that is obtained by adding hydrogen to the fourth trimer acid, a fifth dimer acid which is a reactant of oleic acid, a fifth trimer acid which is a reactant of oleic acid, a fifth hydrogenated dimer acid that is obtained by adding hydrogen to the fifth dimer acid, a fifth hydrogenated trimer acid that is obtained by adding hydrogen to the fifth trimer acid, a sixth dimer acid which is a reactant of linoleic acid, a sixth trimer acid which is a reactant of linoleic acid, a sixth hydrogenated dimer acid that is obtained by adding hydrogen to the sixth dimer acid, a sixth hydrogenated trimer acid that is obtained by adding hydrogen to the sixth trimer acid, a seventh dimer acid which is a reactant of linolenic acid, a seventh trimer acid which is a reactant of linolenic acid, a seventh hydrogenated dimer acid that is obtained by adding hydrogen to the seventh dimer acid, a seventh hydrogenated trimer acid that is obtained by adding hydrogen to the seventh trimer acid, an eighth dimer acid which is a reactant of acrylic acid and oleic acid, an eighth trimer acid which is a reactant of acrylic acid and oleic acid, an eighth hydrogenated dimer acid that is obtained by adding hydrogen to the eighth dimer acid, an eighth hydrogenated trimer acid that is obtained by adding hydrogen to the eighth trimer acid, a ninth dimer acid which is a reactant of acrylic acid and linoleic acid, a ninth trimer acid which is a reactant of acrylic acid and linoleic acid, a ninth hydrogenated dimer acid that is obtained by adding hydrogen to the ninth dimer acid, a ninth hydrogenated trimer acid that is obtained by adding hydrogen to the ninth trimer acid, a tenth dimer acid which is a reactant of acrylic acid and linolenic acid, a tenth trimer acid which is a reactant of acrylic acid and linolenic acid, a tenth hydrogenated dimer acid that is obtained by adding hydrogen to the tenth dimer acid, a tenth hydrogenated trimer acid that is obtained by adding hydrogen to the tenth trimer acid, an eleventh dimer acid which is a reactant of methacrylic acid and oleic acid, an eleventh trimer acid which is a reactant of methacrylic acid and oleic acid, an eleventh hydrogenated dimer acid that is obtained by adding hydrogen to the eleventh dimer acid, an eleventh hydrogenated trimer acid that is obtained by adding hydrogen to the eleventh trimer acid, a twelfth dimer acid which is a reactant of methacrylic acid and linoleic acid, a twelfth trimer acid which is a reactant of methacrylic acid and linoleic acid, a twelfth hydrogenated dimer acid that is obtained by adding hydrogen to the twelfth dimer acid, a twelfth hydrogenated trimer acid that is obtained by adding hydrogen to the twelfth trimer acid, a thirteenth dimer acid which is a reactant of methacrylic acid and linolenic acid, a thirteenth trimer acid which is a reactant of methacrylic acid and linolenic acid, a thirteenth hydrogenated dimer acid that is obtained by adding hydrogen to the thirteenth dimer acid, a thirteenth hydrogenated trimer acid that is obtained by adding hydrogen to the thirteenth trimer acid, a fourteenth dimer acid which is a reactant of oleic acid and linolenic acid, a fourteenth trimer acid which is a reactant of oleic acid and linolenic acid, a fourteenth hydrogenated dimer acid that is obtained by adding hydrogen to the fourteenth dimer acid, a fourteenth hydrogenated trimer acid that is obtained by adding hydrogen to the fourteenth trimer acid, a fifteenth dimer acid which is a reactant of linoleic acid and linolenic acid, a fifteenth trimer acid which is a reactant of linoleic acid and linolenic acid, a fifteenth hydrogenated dimer acid that is obtained by adding hydrogen to the fifteenth dimer acid, a fifteenth hydrogenated trimer acid that is obtained by adding hydrogen to the fifteenth trimer acid, wherein the organohalogen compound is at least one compound selected from the group consisting of: trans-2,3-dibromo-1,4-butenediol, triallyl isocyanurate hexabromide, 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, 2,3-dibromo-2-butene-1,4-diol, trans-2,3-dibromo-2-butene-1,4-diol, cis-2,3-dibromo-2-butene-1,4-diol, 2,2-bis(bromomethyl)-1,3-propanediol, tetrabromoethane, tetrabromobutane, 2,2,2-tribromoethanol, choroalkane, chlorinated fatty acid ester, HET acid, HET acid nonhydrate, fluorochemical surfactant, surfactant including a perfluoroalkyl group, and polytetrafluoroethylene, wherein when 10 mg of the flux is filled in an aluminum pan and heated from 25 degrees C. to 350 degrees C. at a temperature rising rate of 10 degrees C./min under $N_2$ atmosphere, a weight of the flux after heating is 20% or less of a weight of the flux before heating, wherein when the flux is used to form a resin flux cored solder having a composition of Sn-3Ag-0.5Cu, a diameter of 0.8 mm, and containing solder in an amount of 97 wt % and the flux in an amount of 3 wt %, a wet spreading rate calculated according to JIS Z 3197 8.3.1.1 of the resin flux cored solder is 70% or more, and wherein the flux exhibits a transmittance of 50% or less in a corrosion test using a copper mirror based on JIS Z 3197.

2. The flux according to claim 1, wherein the flux is a solid or a liquid having viscosity of 3500 Pa·s or more, at 25 degrees C.

3. The flux according to claim 1, wherein the weight of the flux after heating is 15% or less of the weight of the flux before the heating.

4. The flux according to claim 2, wherein the weight of the flux after is 15% or less of the weight of the flux before the heating.

5. The flux according to claim 1, wherein the volatile rosin is selected from the group consisting of: hydrogenated rosin, hydrogenated and disproportionated rosin, acrylic acid modified and hydrogenated rosin, acrylic acid modified rosin, natural rosin, disproportionated rosin, and combinations thereof.

6. The flux according to claim 2, wherein the volatile rosin is selected from the group consisting of: hydrogenated rosin, hydrogenated and disproportionated rosin, acrylic acid modified and hydrogenated rosin, acrylic acid modified rosin, natural rosin, disproportionated rosin, and combinations thereof.

7. The flux according to claim 3, wherein the volatile rosin is selected from the group consisting of: hydrogenated rosin, hydrogenated and disproportionated rosin, acrylic acid modified and hydrogenated rosin, acrylic acid modified rosin, natural rosin, disproportionated rosin, and combinations thereof.

8. A resin flux cored solder wherein the flux according to claim 1 is filled in the solder.

9. A resin flux cored solder wherein the flux according to claim 2 is filled in the solder.

10. A resin flux cored solder wherein the flux according to claim 3 is filled in the solder.

11. A resin flux cored solder wherein the flux according to claim 4 is filled in the solder.

12. A resin flux cored solder wherein the flux according to claim 5 is filled in the solder.

13. A resin flux cored solder wherein the flux according to claim 6 is filled in the solder.

14. A resin flux cored solder wherein the flux according to claim 7 is filled in the solder.

15. A soldering method, comprising the steps of:
supplying resin flux cored solder, in which the flux of claim 1 is filled, into a through hole formed along a central axis of a soldering iron.

* * * * *